(12) United States Patent
Ohashi

(10) Patent No.: US 11,621,176 B2
(45) Date of Patent: *Apr. 4, 2023

(54) SUBSTRATE PROCESSING APPARATUS

(71) Applicant: SCREEN Holdings Co., Ltd., Kyoto (JP)

(72) Inventor: Yasuhiko Ohashi, Kyoto (JP)

(73) Assignee: SCREEN Holdings Co., Ltd.

( * ) Notice: Subject to any disclaimer, the term of this patent is extended or adjusted under 35 U.S.C. 154(b) by 222 days.

This patent is subject to a terminal disclaimer.

(21) Appl. No.: 17/095,954

(22) Filed: Nov. 12, 2020

(65) Prior Publication Data

US 2021/0066094 A1    Mar. 4, 2021

Related U.S. Application Data

(63) Continuation of application No. 14/776,963, filed as application No. PCT/JP2014/054880 on Feb. 27, 2014, now abandoned.

(30) Foreign Application Priority Data

Mar. 15, 2013    (JP) ................................ 2013-052915

(51) Int. Cl.
  *H01L 21/67*    (2006.01)
  *H01L 21/687*    (2006.01)
(52) U.S. Cl.
  CPC ...... *H01L 21/6708* (2013.01); *H01L 21/6719* (2013.01); *H01L 21/67028* (2013.01);
  (Continued)
(58) Field of Classification Search
  None
  See application file for complete search history.

(56) References Cited

U.S. PATENT DOCUMENTS 9,555,437 B2    1/2017 Nakai et al.
10,229,846 B2*    3/2019 Kikumoto ........... H01L 21/6708
(Continued)

FOREIGN PATENT DOCUMENTS

CN    102214548 A    10/2011
JP    2009-147152    7/2009
(Continued)

OTHER PUBLICATIONS

PCT/IB/326 Notification Concerning Transmittal of International Preliminary Report on Patentability including PCT/IB373 and PCT/ISA/237 in Japanese.

(Continued)

*Primary Examiner* — Karla A Moore
*Assistant Examiner* — Margaret Klunk
(74) *Attorney, Agent, or Firm* — Ostrolenk Faber LLP

(57) ABSTRACT

In a substrate processing apparatus (1), an enlarged sealed space (100) is formed by bringing a cup part (161) that forms a lateral space (160) around the outer periphery of a chamber (12) into contact with a chamber lid part (122) separated from a chamber body (121). A scan nozzle (188) is attached to the cup part (161) in the lateral space (160) and supplies a chemical solution onto a substrate after moving to above the substrate through an annular opening (81). During processing for cleaning the substrate and processing for drying the substrate, the scan nozzle (188) is housed in the lateral space (160) and an upper opening of the chamber body (121) is closed by the chamber lid part (122) to isolate the chamber space (120) from the lateral space (160) and seal the chamber space (120). Thus, the chamber space (120) can be isolated from the scan nozzle (188). This consequently prevents a mist or the like of the chemical solution supplied from the scan nozzle (188) from adhering to the substrate.

7 Claims, 16 Drawing Sheets

(52) U.S. Cl.
CPC .. *H01L 21/67051* (2013.01); *H01L 21/67126* (2013.01); *H01L 21/68742* (2013.01); *H01L 21/68792* (2013.01)

(56) References Cited

U.S. PATENT DOCUMENTS

| | | | |
|---|---|---|---|
| 10,366,908 B2* | 7/2019 | Yoshida | H01L 21/67742 |
| 2001/0014224 A1 | 8/2001 | Hasebe et al. | 396/579 |
| 2002/0144719 A1* | 10/2002 | Nagamine | B08B 3/04 |
| | | | 134/182 |
| 2003/0010671 A1* | 1/2003 | Orii | H01L 21/67178 |
| | | | 206/711 |
| 2003/0170988 A1* | 9/2003 | Izumi | B05B 7/066 |
| | | | 438/689 |
| 2003/0196986 A1* | 10/2003 | Tsung-Kuei | H01L 21/67115 |
| | | | 216/2 |
| 2004/0050491 A1 | 3/2004 | Miya et al. | 156/345.11 |
| 2007/0042511 A1 | 2/2007 | Abiko et al. | 438/14 |
| 2007/0289527 A1* | 12/2007 | Ito | G03F 7/3021 |
| | | | 118/52 |
| 2011/0220286 A1 | 9/2011 | Park et al. | 156/345.11 |
| 2011/0240601 A1* | 10/2011 | Hashizume | H01L 21/67051 |
| | | | 156/345.23 |
| 2012/0103522 A1 | 5/2012 | Hohenwarter | 156/345.23 |
| 2014/0060423 A1 | 3/2014 | Nakai et al. | 118/50 |
| 2016/0351421 A1* | 12/2016 | Iwao | H01L 21/67051 |
| 2017/0117135 A1 | 4/2017 | Yoshida et al. | |
| 2017/0148648 A1 | 5/2017 | Yoshida | |

FOREIGN PATENT DOCUMENTS

| | | |
|---|---|---|
| JP | 2011-211092 | 10/2011 |
| JP | 2011-216608 | 10/2011 |
| KR | 100749547 B1 | 8/2007 |
| TW | I349958 B | 11/2007 |
| TW | I309063 B | 4/2009 |
| TW | I314487 B | 9/2009 |
| TW | 201138990 A1 | 11/2011 |
| TW | I385719 B | 2/2013 |

OTHER PUBLICATIONS

PCT/IB/338 Notification of Transmittal of Translation of the International Preliminary Report on Patentability including PCT/IB/373 and PCT/ISA/237 in English.

* cited by examiner

SUBSTRATE PROCESSING APPARATUS

CROSS-REFERENCE TO RELATED APPLICATIONS

The present application is a continuation of U.S. patent application Ser. No. 14/776,963, filed Sep. 15, 2015, which is a 35 U.S.C. §§ 371 national phase conversion of PCT/JP2014/054880, filed Feb. 27, 2014, which claims priority to Japanese Patent Application No. 2013-052915, filed Mar. 15, 2013, the contents of both of which are incorporated herein by reference. The PCT International Application was published in the Japanese language.

TECHNICAL FIELD

The present invention relates to a substrate processing apparatus for processing a substrate.

BACKGROUND ART

A process of manufacturing a semiconductor substrate (hereinafter, simply referred to as a "substrate") conventionally involves various types of processing performed on the substrate with use of various types of substrate processing apparatuses. An example of the processing performed is supplying a chemical solution to a substrate having a resist pattern on its surface to thereby etch the surface of the substrate. After completion of the etching processing, processing such as removing the resist on the substrate and cleaning the substrate is also performed.

Japanese Patent Application Laid-Open No. 2011-216608 (Document 1) discloses an apparatus for processing a substrate by ejecting a processing liquid from a nozzle onto the main surface of the substrate in the internal space of a sealed chamber. The nozzle is supported by a nozzle arm at a position above the substrate, and the nozzle arm extends between the inside and outside of the sealed chamber through a through hole formed in the sealed chamber. The through hole is sealed with a sealing structure. In the case of processing the substrate, the nozzle is moved together with the nozzle arm along the main surface of the substrate that is being rotated.

Incidentally, the apparatus of Document 1, after completion of a series of processes on the substrate, performs a step (so-called spin-drying) of rotating the substrate at a high speed in the sealed chamber to dry the substrate. Even during this process of drying the substrate, the nozzle used to eject the chemical solution remains in the sealed chamber. Thus, a mist or the like of the chemical solution from the nozzle may adhere to the substrate.

SUMMARY OF INVENTION

The present invention is intended for a substrate processing apparatus for processing a substrate, and it is an object of the present invention to isolate a chamber space from a processing liquid supply part for supplying a processing liquid to a substrate in a sealed space.

The substrate processing apparatus according to the present invention includes a chamber that includes a chamber body and a chamber lid part, which form a chamber space, and in which the chamber space is sealed by closing an upper opening of the chamber body with the chamber lid part, a chamber opening-and-closing mechanism for moving the chamber lid part relative to the chamber body in an up-down direction, a substrate holding part disposed in the chamber space and for holding a substrate in a horizontal state, a substrate rotation mechanism for rotating the substrate along with the substrate holding part about a central axis pointing in the up-down direction, a cup part located outside of and around an entire periphery of the chamber, forming a lateral space along an outer periphery of the chamber, and for receiving a processing liquid dispersed from the substrate that is being rotated, through an annular opening that is formed around the substrate when the chamber lid part is separated from the chamber body, and a processing liquid supply part attached to the chamber or the cup part in the lateral space and for moving to above the substrate through the annular opening and supplying a processing liquid onto the substrate or for supplying a processing liquid onto the substrate through the annular opening. When the cup part is in contact with the chamber lid part in a state where the annular opening is formed, the chamber space and the lateral space form a single enlarged sealed space.

According to the present invention, the chamber space can be isolated from the processing liquid supply part.

In a preferred embodiment of the present invention, the processing liquid supply part includes an ejection head for ejecting the processing liquid, and a head support part that is a member extending in a horizontal direction and has a free end to which the ejection head is fixed and a fixed end attached to the chamber or the cup part in the lateral space. The substrate processing apparatus further includes a head rotation mechanism for rotating the head support part along with the ejection head about the fixed end. When the processing liquid is supplied onto the substrate, the head support part is rotated by the head rotation mechanism to move the ejection head to above the substrate through the annular opening.

More preferably, the head rotation mechanism is disposed outside the enlarged sealed space.

Yet more preferably, the substrate processing apparatus further includes a cup-part movement mechanism for moving the cup part in the up-down direction between a liquid-receiving position that is outside the annular opening and a retracted position that is below the liquid-receiving position. The head rotation mechanism is fixed to an upper part of the cup part and moves along with the cup part in the up-down direction.

Alternatively, the head rotation mechanism is fixed to the chamber lid part and moves along with the chamber lid part relative to the chamber body in the up-down direction.

In another preferred embodiment of the present invention, the ejection head supplies the processing liquid onto the substrate while moving back and forth along a predetermined travel path, above the substrate that is being pretoated by the substrate rotation mechanism.

In another preferred embodiment of the present invention, the substrate processing apparatus further includes another cup part located outside of and around an entire periphery of the annular opening in the enlarged sealed space and for receiving the processing liquid dispersed from the substrate that is being rotated, and another cup-part movement mechanism for moving the another cup part independently of the cup part in the up-down direction between a liquid-receiving position that is outside the annular opening and a retracted position that is below the liquid-receiving position.

In another preferred embodiment of the present invention, the processing liquid is pre-dispensed from the processing liquid supply part in a state where the processing liquid supply part is housed in the lateral space.

These and other objects, features, aspects and advantages of the present invention will become more apparent from the following detailed description of the present invention when taken in conjunction with the accompanying drawings.

DESCRIPTION OF EMBODIMENTS

Figure 1:
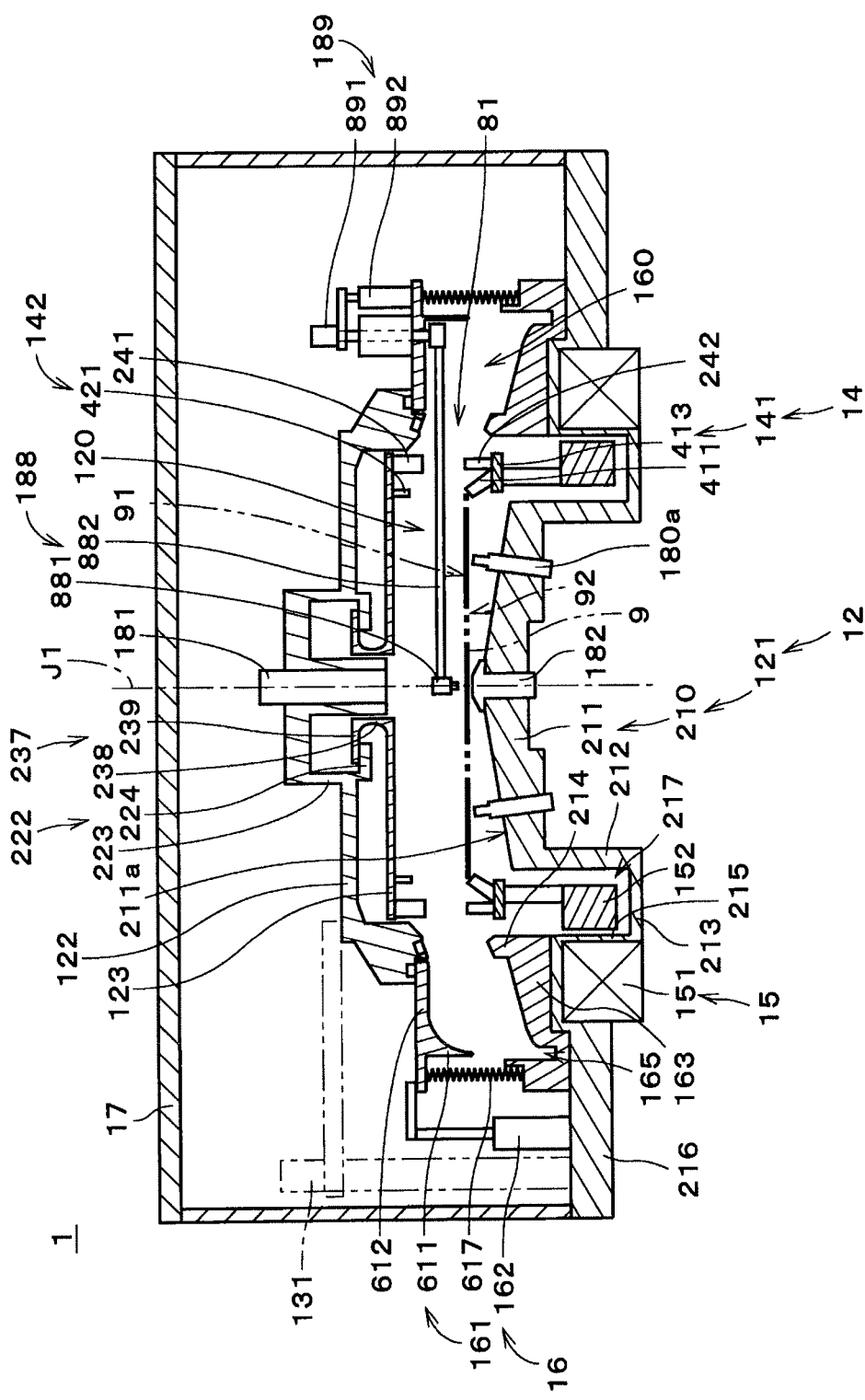
FIG. 1 is a cross-sectional view of a substrate processing apparatus according to a first embodiment.

FIG. 1 is a cross-sectional view of a substrate processing apparatus 1 according to a first embodiment of the present invention. The substrate processing apparatus 1 is a single-wafer processing apparatus that supplies a processing liquid to a generally disc-shaped semiconductor substrate 9 (hereinafter, simply referred to as a "substrate 9") and processes the substrate 9 one at a time. In FIG. 1, cross-sections of some constituent elements of the substrate processing apparatus 1 have not been diagonally hatched (the same applies to the other cross-sectional views).

The substrate processing apparatus 1 includes a chamber 12, a top plate 123, a chamber opening-and-closing mechanism 131, a substrate holding part 14, a substrate rotation mechanism 15, a liquid receiving part 16, and a cover 17. The cover 17 covers the top and sides of the chamber 12.

The chamber 12 includes a chamber body 121 and a chamber lid part 122. The chamber 12 has a generally cylindrical shape centered on a central axis J1 pointing in an up-down direction. The chamber body 121 includes a chamber bottom part 210 and a chamber sidewall part 214. The chamber bottom part 210 includes a generally disc-shaped central part 211, a generally cylindrical inner sidewall part 212 that extends downward from the outer edge of the central part 211, a generally annular plate-like annular bottom part 213 that extends radially outward from the lower end of the inner side-wall part 212, a generally cylindrical outer sidewall part 215 that extends upward from the outer edge of the annular bottom part 213, and a generally annular plate-like base part 216 that extends radially outward from the upper end of the outer side-wall part 215.

The chamber side-wall part 214 has an annular shape centered on the central axis J1. The chamber side-wall part 214 projects upward from the inner edge of the base part 216. A member that forms the chamber side-wall part 214 also serves as part of the liquid receiving part 16, as will be described later. In the following description, a space surrounded by the chamber side-wall part 214, the outer side-wall part 215, the annular bottom part 213, the inner side-wall part 212, and the outer edge of the central part 211 is referred to as a "lower annular space 217."

When the substrate 9 is supported by a substrate support part 141 (described later) of the substrate holding part 14, a lower surface 92 of the substrate 9 opposes the upper surface of the central part 211 of the chamber bottom part 210. In the following description, the central part 211 of the chamber bottom part 210 is referred to as a "lower-surface opposing part 211," and an upper surface 211a of the central part 211 is referred to as an "opposing surface 211a." The details of the lower-surface opposing part 211 will be described later.

The chamber lid part 122 has a generally disc shape perpendicular to the central axis J1 and includes the upper part of the chamber 12. The chamber lid part 122 closes an upper opening of the chamber body 121. FIG. 1 illustrates a state where the chamber lid part 122 is separated from the chamber body 121. When the chamber lid part 122 closes the upper opening of the chamber body 121, the outer edge of the chamber lid part 122 is in contact with the upper part of the chamber side-wall part 214.

The chamber opening-and-closing mechanism 131 moves the chamber lid part 122, which is a movable part of the chamber 12, relative to the chamber body 121, which is the other area of the chamber 12, in the up-down direction. The chamber opening-and-closing mechanism 131 is a lid elevating mechanism for moving the chamber lid part 122 up and down. When the chamber lid part 122 is moved in the up-down direction by the chamber opening-and-closing mechanism 131, the top plate 123 also moves along with the chamber lid part 122 in the up-down direction. As a result of the chamber lid part 122 being brought into contact with the chamber body 121 to close the upper opening and being pushed against the chamber body 121, a sealed chamber space 120 (see FIG. 7) is formed in the chamber 12. In other words, the chamber space 120 is sealed by the chamber lid part 122 closing the upper opening of the chamber body 121.

The substrate holding part 14 is disposed in the chamber space 120 and holds the substrate 9 in a horizontal state. That is, the substrate 9 is held by the substrate holding part 14 with its upper surface 91 facing up in the direction perpendicular to the central axis J1. The substrate holding part 14 includes the aforementioned substrate support part 141 for supporting the outer edge (i.e., an area including and in the vicinity of the outer edge) of the substrate 9, and a substrate pressing part 142 for pressing on the outer edge of the substrate 9 supported by the substrate support part 141 from above. The substrate support part 141 includes a supporter base 413 having a generally annular plate-like shape centered on the central axis J1, and a plurality of first contact parts 411 that are fixed to the upper surface of the supporter base 413. The substrate pressing part 142 includes a plurality of second contact parts 421 that are fixed to the lower surface of the top plate 123. In actuality, the positions of the plurality of second contact parts 421 in the peripheral direction are different from those of the plurality of first contact parts 411.

The top plate 123 has a generally disc shape perpendicular to the central axis J1. The top plate 123 is disposed below the chamber lid part 122 and above the substrate support part 141. The top plate 123 has an opening at the center. When the substrate 9 is supported by the substrate support part 141, the upper surface 91 of the substrate 9 opposes the lower surface of the top plate 123 that is perpendicular to the central axis J1. The top plate 123 has a greater diameter than the substrate 9, and the entire outer peripheral edge of the top plate 123 is located radially outward of the outer peripheral edge of the substrate 9.

In the state illustrated in FIG. 1, the top plate 123 is suspended from and supported by the chamber lid part 122. The chamber lid part 122 includes a generally annular plate holding part 222 in the central portion. The plate holding part 222 includes a cylindrical part 223 having a generally cylindrical shape centered on the central axis J1, and a flange part 224 having a generally disc shape centered on the central axis J1. The flange part 224 extends radially inward from the lower end of the cylindrical part 223.

The top plate 123 includes an annular held part 237. The held part 237 includes a cylindrical part 238 having a generally cylindrical shape centered on the central axis J1, and a flange part 239 having a generally disc shape centered on the central axis J1. The cylindrical part 238 extends upward from the upper surface of the top plate 123. The flange part 239 extends radially outward from the upper end of the cylindrical part 238. The cylindrical part 238 is located radially inward of the cylindrical part 223 of the plate holding part 222. The flange part 239 is located above the flange part 224 of the plate holding part 222 and opposes the flange part 224 in the up-down direction. As a result of the lower surface of the flange part 239 of the held part 237 being brought into contact with the upper surface of the flange part 224 of the plate holding part 222, the top plate 123 is mounted on the chamber lid part 122 so as to be suspended from the chamber lid part 122.

The substrate rotation mechanism 15 illustrated in FIG. 1 is a so-called hollow motor. The substrate rotation mechanism 15 includes a stator 151 and a rotor 152, both having an annular shape centered on the central axis J1. The rotor 152 includes a generally annular permanent magnet. The surface of the permanent magnet is molded of a PTFE resin. The rotor 152 is disposed in the lower annular space 217 in the chamber space 120 of the chamber 12. The supporter base 413 of the substrate support part 141 is attached to the upper part of the rotor 152 via a connection member. The supporter base 413 is disposed above the rotor 152.

The stator 151 is disposed around, i.e., radially outward of, the rotor 152 outside the chamber 12 (i.e., outside the chamber space 120). In the present embodiment, the stator 151 is fixed to the outer side-wall part 215 and the base part 216 of the chamber bottom part 210 and located below the liquid receiving part 16. The stator 151 includes a plurality of coils arrayed peripherally about the central axis J1.

When current is supplied to the stator 151, a torque acting about the central axis J1 is produced between the stator 151 and the rotor 152. This causes the rotor 152 to rotate in a horizontal state about the central axis J1. The magnetic force acting between the stator 151 and the rotor 152 allows the rotor 152 to float in the chamber 12 without direct or indirect contact with the chamber 12 and to rotate the substrate 9 and the substrate holding part 14 in a floating state about the central axis J1.

The liquid receiving part 16 includes a cup part 161, a cup-part movement mechanism 162, and a cup opposing part 163. The cup part 161 has an annular shape centered on the central axis J1 and is located radially outward of and around the entire periphery of the chamber 12. The cup-part movement mechanism 162 moves the cup part 161 in the up-down direction. The cup-part movement mechanism 162 is disposed radially outward of the cup part 161. The cup-part movement mechanism 162 is disposed at a different position from that of the aforementioned chamber opening-and-closing mechanism 131 in the peripheral direction. The cup opposing part 163 is located below the cup part 161 and opposes the cup part 161 in the up-down direction. The cup opposing part 163 is part of the member forming the chamber side-wall part 214. The cup opposing part 163 includes an annular liquid-receiving recessed part 165 that is located radially outward of the chamber side-wall part 214.

The cup part 161 includes a sidewall part 611, an upper surface part 612, and a bellows 617. The side-wall part 611 has an approximately cylindrical shape centered on the central axis J1. The upper surface part 612 has an approximately annular plate-like shape centered on the central axis J1 and extends radially inward and outward from the upper end of the side-wall part 611. The lower part of the side-wall part 611 is located within the liquid-receiving recessed part 165 of the cup opposing part 163. The cross-sectional shape of the side-wall part 611 differs between an area where a scan nozzle 188, which will be described later, is housed (an area on the right side in FIG. 1) and the other area (an area on the left side in FIG. 1). The right-side area of the side-wall part 611 in FIG. 1 has a slightly smaller radial thickness than that of the left-side area thereof in FIG. 1.

The bellows 617 has a generally cylindrical shape centered on the central axis J1 and is extendable in the up-down direction. The bellows 617 is provided radially outward of and around the entire periphery of the side-wall part 611. The bellows 617 is made of a material that prevents passage of gas and liquid. The upper end of the bellows 617 is connected to the lower surface of the outer edge portion of the upper surface part 612 around the entire periphery thereof. In other words, the upper end of the bellows 617 is indirectly connected to the side-wall part 611 via the upper surface part 612. The connection between the bellows 617 and the upper surface part 612 is sealed to prevent passage of gas and liquid. The lower end of the bellows 617 is indirectly connected to the chamber body 121 via the cup opposing part 163. Passage of gas and liquid is also prevented at the connection between the lower end of the bellows 617 and the cup opposing part 163.

An upper nozzle 181 is fixed at the center of the chamber lid part 122. The upper nozzle 181 can be inserted into the opening at the center of the top plate 123. The upper nozzle 181 has a liquid outlet at the center and jet openings around the liquid outlet. A lower nozzle 182 is attached at the center of the lower-surface opposing part 211 of the chamber bottom part 210. A plurality of gas jet nozzles 180a are further attached to the lower-surface opposing part 211. The plurality of gas jet nozzles 180a are, for example, equiangularly arranged peripherally about the central axis J1. Note that the installation locations of the upper nozzle 181 and the lower nozzle 182 are not limited to the central part, and the upper nozzle 181 and the lower nozzle 182 may be located at, for example, positions opposing the outer edge of the substrate 9.

The scan nozzle 188 is attached to the upper surface part 612 of the cup part 161. The scan nozzle 188 includes an ejection head 881 for ejecting a processing liquid, and a head support part 882. The head support part 882 is a rod-like member that extends approximately in a horizontal direction. A fixed end that is one end of the head support part 882 is attached to the lower surface of the upper surface part 612 of the cup part 161. A free end that is the other end of the head support part 882 is fixed to the ejection head 881.

A head movement mechanism 189 is provided on the upper part of the cup part 161. The head movement mechanism 189 is fixed to the upper surface of the upper surface part 612 of the cup part 161 above the fixed end of the head support part 882. The head movement mechanism 189 includes a head rotation mechanism 891 and a head elevating mechanism 892. The head rotation mechanism 891 is connected to the fixed end of the head support part 882 through the upper surface part 612 of the cup part 161 and rotates the head support part 882 along with the ejection head 881 approximately horizontally about the fixed end. The portion of the cup part 161 where the head rotation mechanism 891 passes through is sealed to prevent passage of gas and liquid. The head elevating mechanism 892 moves the head support part 882 and the ejection head 881 up and down by moving the fixed end of the head support part 882 in the up-down direction. The head movement mechanism 189 is moved along with the cup part 161 in the up-down direction by the cup-part movement mechanism 162.

Figure 2:
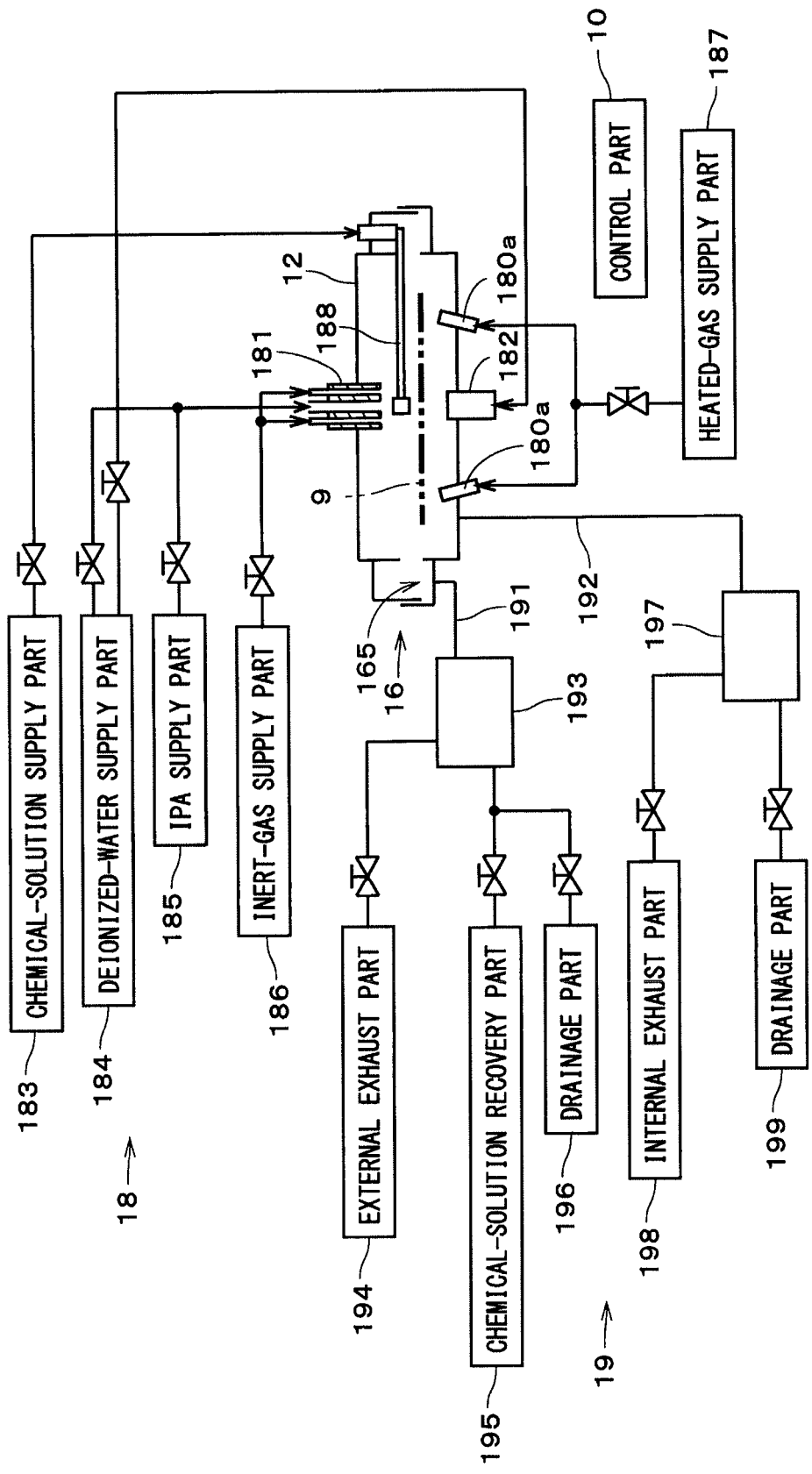
FIG. 2 is a block diagram of a gas-liquid supply part and a gas-liquid discharge part.

FIG. 2 is a block diagram of a gas-liquid supply part 18 and a gas-liquid discharge part 19 of the substrate processing apparatus 1. The gas-liquid supply part 18 includes a chemical-solution supply part 183, a deionized-water supply part 184, an IPA supply part 185, an inert-gas supply part 186, and a heated-gas supply part 187, in addition to the scan nozzle 188, the gas jet nozzles 180*a*, the upper nozzle 181, and the lower nozzle 182, which are described above. The chemical-solution supply part 183 is connected to the scan nozzle 188 via a valve. The deionized-water supply part 184 and the IPA supply part 185 are each connected to the upper nozzle 181 via a valve. The lower nozzle 182 is connected to the deionized-water supply part 184 via a valve. The upper nozzle 181 is also connected to the inert-gas supply part 186 via a valve. The upper nozzle 181 is part of a gas supply part for supplying a gas to the interior of the chamber 12. The plurality of gas jet nozzles 180*a* are each connected to the heated-gas supply part 187 via a valve.

A first exhaust passage 191 that is connected to the liquid-receiving recessed part 165 of the liquid receiving part 16 is connected to a gas-liquid separating part 193. The gas-liquid separating part 193 is connected to an external exhaust part 194, a chemical-solution recovery part 195, and a drainage part 196 via different valves. A second exhaust passage 192 that is connected to the chamber bottom part 210 is connected to a gas-liquid separating part 197. The gas-liquid separating part 197 is connected to an internal exhaust part 198 and a drainage part 199 via different valves. Each constituent element of the gas-liquid supply part 18 and the gas-liquid discharge part 19 is controlled by a control part 10. The chamber opening-and-closing mechanism 131, the substrate rotation mechanism 15, the cup-part movement mechanism 162, and the head movement mechanism 189 (see FIG. 1) are also controlled by the control part 10.

A chemical solution supplied from the chemical-solution supply part 183 to the substrate 9 through the scan nozzle 188 is, for example, an etchant such as hydrofluoric acid or an aqueous solution of tetramethyl ammonium hydroxide. The deionized-water supply part 184 supplies deionized water (DIW) to the substrate 9 through the upper nozzle 181 or the lower nozzle 182. The IPA supply part 185 supplies isopropyl alcohol (IPA) to the substrate 9 through the upper nozzle 181. The substrate processing apparatus 1 may also include other processing liquid supply parts for supplying processing liquids other than the aforementioned processing liquids (a chemical solution, deionized water, and IPA).

The inert-gas supply part 186 supplies an inert gas into the chamber 12 through the upper nozzle 181. The heated-gas supply part 187 supplies a heated gas (e.g., a high-temperature inert gas that is heated to 160 to 200 degrees) to the lower surface 92 of the substrate 9 through the plurality of gas jet nozzles 180*a*. In the present embodiment, the gas used in the inert-gas supply part 186 and the heated-gas supply part 187 is a nitrogen ($N_2$) gas, but it may be a gas other than a nitrogen gas. Note that in the case of using an inert gas heated in the heated-gas supply part 187, measures against explosions in the substrate processing apparatus 1 can be simplified or eliminated.

As illustrated in FIG. 1, a plurality of first engagement parts 241 are arrayed peripherally on the lower surface of the outer edge portion of the top plate 123, and a plurality of second engagement part 242 are arrayed peripherally on the upper surface of the supporter base 413. In actuality, the first engagement parts 241 and the second engagement parts 242 are disposed at different positions in the peripheral direction from those of the plurality of first contact parts 411 of the substrate support part 141 and the plurality of second contact parts 421 of the substrate pressing part 142. It is preferable for three or more sets of these engagement parts to be provided, and in the present embodiments, four sets of engagement parts are provided. The first engagement parts 241 have a recessed portion that is recessed upward at the bottom. The second engagement parts 242 project upward from the supporter base 413.

Figure 3:
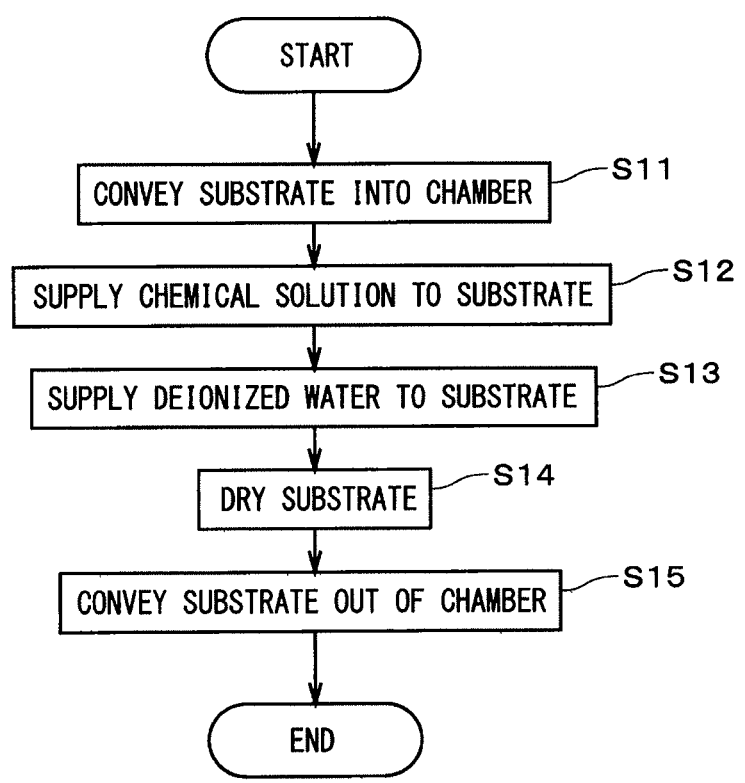
FIG. 3 is a flowchart of processing performed by the substrate processing apparatus.
Figure 4:
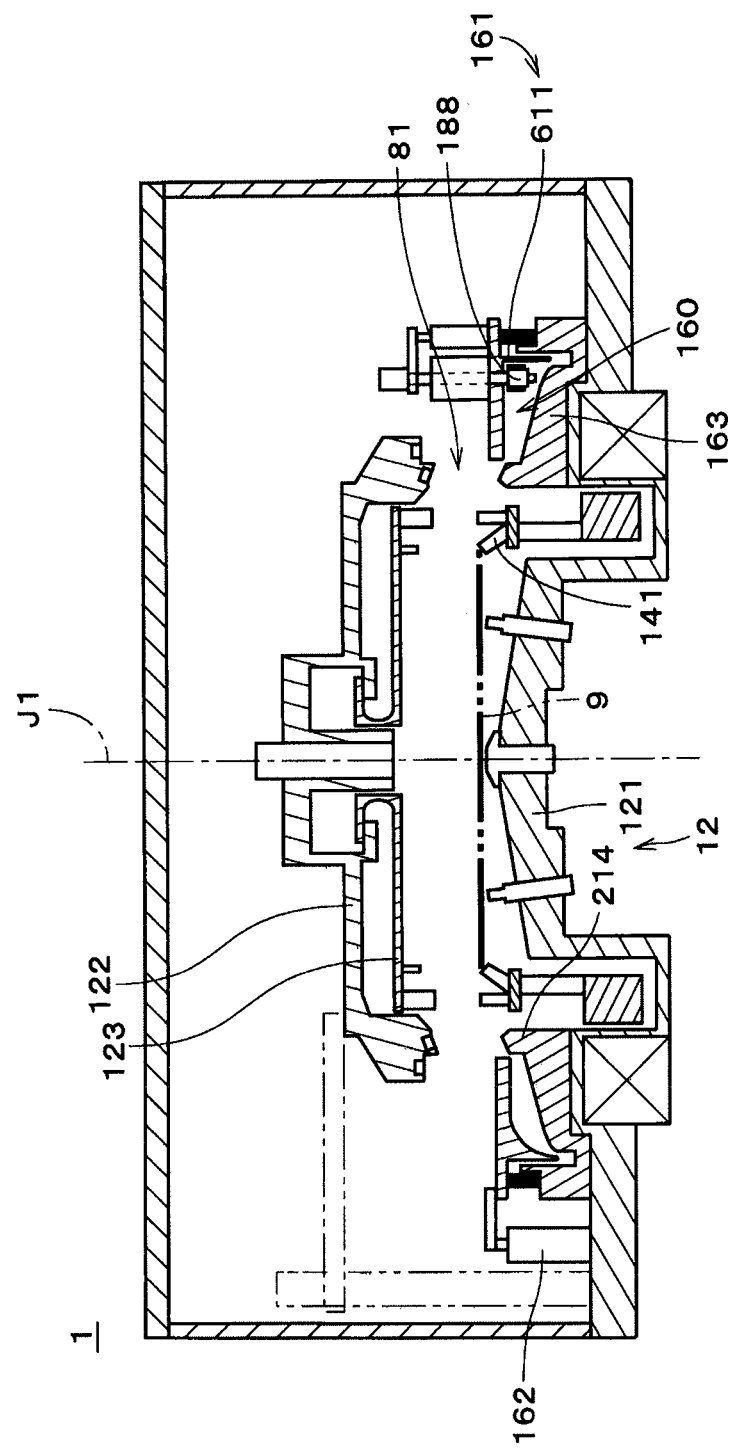
FIG. 4 is a cross-sectional view of the substrate processing apparatus.

FIG. 3 is a flowchart of processing performed on the substrate 9 by the substrate processing apparatus 1. In the substrate processing apparatus 1, when the chamber lid part 122 is located above and separated from the chamber body 121 and the cup part 161 is located below and separated from the chamber lid part 122 as illustrated in FIG. 4, the substrate 9 is conveyed into the chamber 12 by an external conveying mechanism and supported from the underside by the substrate holding part 14 (step S11). The state where the chamber 12 and the cup part 161 are as illustrated in FIG. 4 is hereinafter referred to as an "open state." An opening between the chamber lid part 122 and the chamber side-wall part 214 has an annular shape centered on the central axis J1 and is hereinafter referred to as an "annular opening 81." In the substrate processing apparatus 1, the annular opening 81 is formed around (i.e., radially outward of) the substrate 9 as a result of the chamber lid part 122 being separated from the chamber body 121. In step S11, the substrate 9 is conveyed through the annular opening 81.

Figure 5:
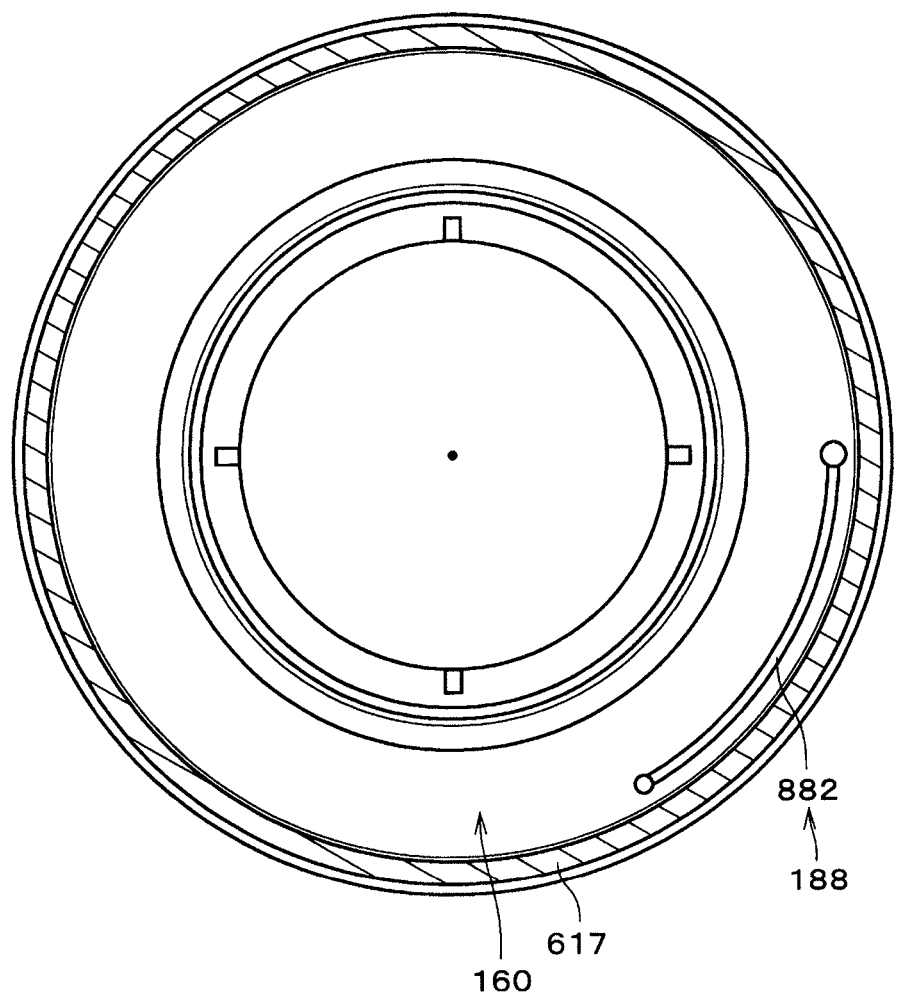
FIG. 5 is a plan view of part of the substrate processing apparatus.

For the conveyance of the substrate 9, the scan nozzle 188 is housed in advance in a space 160 that is formed between the cup part 161 and the cup opposing part 163. The space 160 is a generally annular space surrounding the entire outer periphery of the chamber 12. In the following description, the space 160 is referred to as a "lateral space 160." FIG. 5 is a plan view of the substrate processing apparatus 1. For ease of understanding of the state where the scan nozzle 188 is housed, illustration of constituent elements such as the chamber lid part 122 and the cup part 161 is omitted in FIG. 5. The bellows 617 is diagonally hatched.

As illustrated in FIG. 5, the head support part 882 of the scan nozzle 188 is radially outwardly curved to form a convex shape in plan view. In other words, the scan nozzle 188 has a generally arc-like shape. In the lateral space 160, the scan nozzle 188 is disposed such that the head support part 882 is along the bellows 617 and the side-wall part 611 (see FIG. 4) of the cup part 161.

In the case of housing the scan nozzle 188, in a state where the cup part 161 is located at the position illustrated in FIG. 1, the scan nozzle 188 is rotated by the head rotation mechanism 891 and moved to the outside of the chamber 12 through the annular opening 81. The scan nozzle 188 is thereby housed in the lateral space 160 between the cup part 161 and the cup opposing part 163. Then, the cup part 161 is moved down to the position illustrated in FIG. 4 by the cup-part movement mechanism 162. The lateral space 160 becomes smaller as the cup part 161 moves downward.

Figure 6:
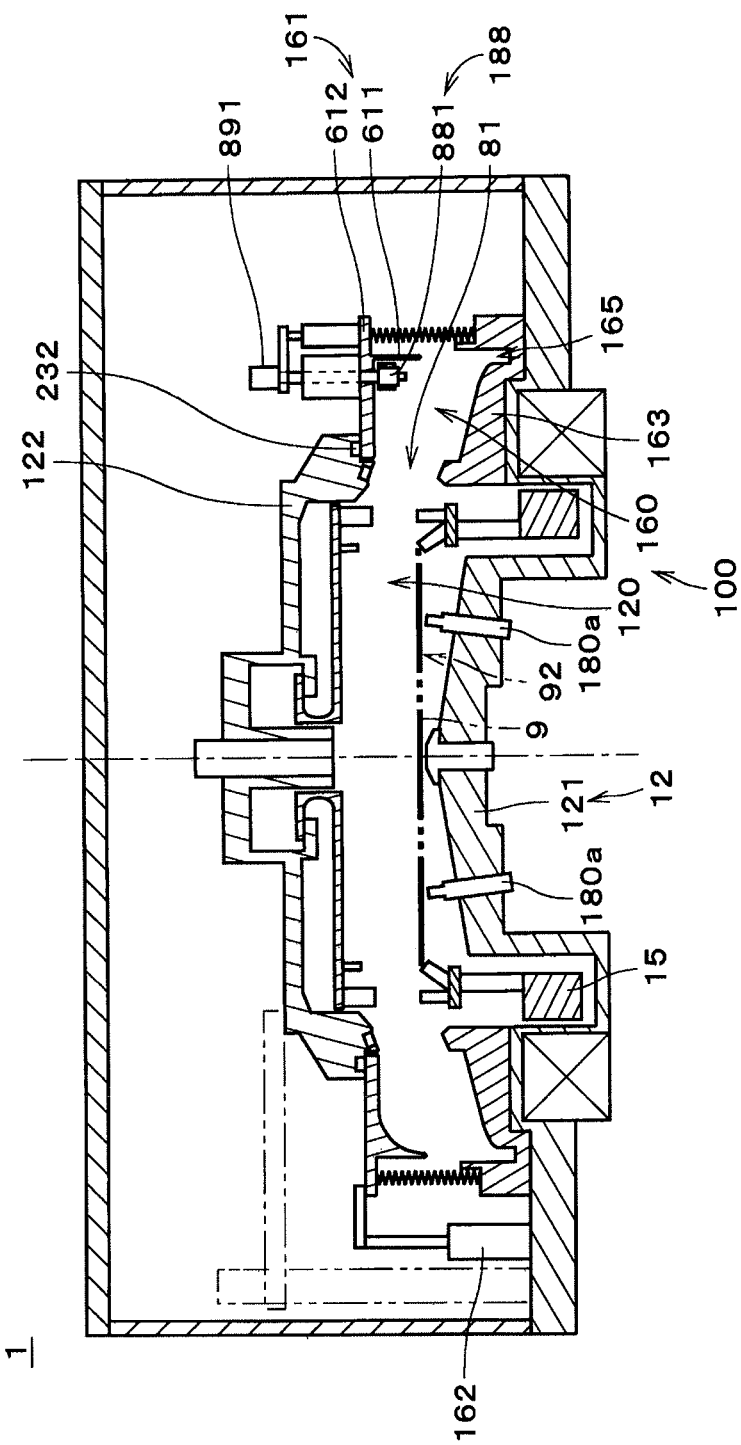
FIG. 6 is a cross-sectional view of the substrate processing apparatus.

Once the substrate 9 has been conveyed into the chamber 12, the cup part 161 is moved up from the position illustrated in FIG. 4 to the position illustrated in FIG. 6 and is thereby located radially outward of and around the entire periphery of the annular opening 81. In the following description, the state where the chamber 12 and the cup part 161 are as illustrated in FIG. 6 is referred to as a "first sealed state" (the same applies to the state in FIG. 1). The position of the cup part 161 in FIG. 6 is referred to as a "liquid-receiving position" and the position of the cup part 161 in FIG. 4 is referred to as a "retracted position." The cup-part movement mechanism 162 moves the cup part 161 in the up-down direction between the liquid-receiving position that is radially outward of the annular opening 81 and the retracted position that is below the liquid-receiving position.

When the cup part 161 is located at the liquid-receiving position, the side-wall part 611 opposes the annular opening 81 in the radial direction. Also, the upper surface of the inner edge portion of the upper surface part 612 is, around the entire periphery thereof, in contact with a rip seal 232 that is provided at the lower end of the outer edge portion of the chamber lid part 122. A seal part for preventing passage of gas and liquid is formed between the chamber lid part 122 and the upper surface part 612 of the cup part 161. This produces a sealed space (hereinafter, referred to as an "enlarged sealed space 100") that is surrounded by the chamber body 121, the chamber lid part 122, the cup part 161, and the cup opposing part 163. The enlarged sealed space 100 is a single space formed by communication of the chamber space 120, which is formed between the chamber lid part 122 and the chamber body 121, and the lateral space 160, which is surrounded by the cup part 161 and the cup opposing part 163, through the annular opening 81.

Next, the substrate rotation mechanism 15 starts rotating the substrate 9 at a constant rotational speed, which is a relatively low rotational speed and hereinafter referred to as a "steady-state rotational speed." Moreover, the supply of an inert gas (here, a nitrogen gas) from the inert-gas supply part 186 (see FIG. 2) to the enlarged sealed space 100 is started, and the discharge of the gas within the enlarged sealed space 100 from the external exhaust part 194 is started. Thus, after a predetermined period of time has elapsed, the enlarged sealed space 100 is in an inert-gas-filled state in which the enlarged sealed space 100 is filled with the inert gas (i.e., a hypoxic atmosphere where the oxygen concentration is low). Note that the supply of the inert gas to the enlarged sealed space 100 and the discharge of the gas contained in the enlarged sealed space 100 may be started in the open state illustrated in FIG. 4.

Then, a heated gas is ejected from the plurality of gas jet nozzles 180a toward the lower surface 92 of the rotating substrate 9. This heats the substrate 9. Furthermore, a predetermined amount of the chemical solution is supplied from the chemical-solution supply part 183 to the scan nozzle 188 attached to the cup part 161 in the lateral space 160 under the control of the control part 10 (see FIG. 2). Thus, the chemical solution is pre-dispensed from the ejection head 881 in a state where the scan nozzle 188 is housed in the lateral space 160 (i.e., the scan nozzle 188 as a whole is located within the lateral space 160). The chemical solution pre-dispensed from the ejection head 881 is received by the liquid-receiving recessed part 165.

After completion of the pre-dispense, the head support part 882 is rotated by the head rotation mechanism 891 disposed outside the enlarged sealed space 100, and as illustrated in FIG. 1, the ejection head 881 moves to above the substrate 9 through the annular opening 81. Moreover, the head rotation mechanism 891 is controlled by the control part 10 to start reciprocating movement of the ejection head 881 above the substrate 9. The ejection head 881 continuously moves reciprocally in the horizontal direction along a predetermined travel path that connects the central portion and the outer edge of the substrate 9.

Then, the chemical solution is supplied from the chemical-solution supply part 183 to the ejection head 881, and the chemical solution is supplied from the ejection head 881 that is swinging in the horizontal direction to the upper surface 91 of the substrate 9 (step S12). The chemical solution from the ejection head 881 is continuously supplied to the upper surface 91 of the rotating substrate 9. The chemical solution is spread to the outer periphery by the rotation of the substrate 9, and the entire upper surface 91 is covered with the chemical solution. The scan nozzle 188 is a processing-liquid supply part for supplying a processing liquid onto the rotating substrate 9. Supplying the chemical solution from the horizontally swinging ejection head 881 to the rotating substrate 9 allows the chemical solution to be approximately uniformly supplied to the upper surface 91 of the substrate 9. This also improves uniformity in the temperature of the chemical solution on the substrate 9. As a result, uniformity in the chemical-solution processing performed on the substrate 9 can be improved.

During the supply of the processing liquid from the scan nozzle 188, the heated gas also continues to be ejected from the gas jet nozzles 180a. Thus, the upper surface 91 is etched with the chemical solution while the substrate 9 is heated to approximately a desired temperature. This consequently further improves the uniformity in the chemical-solution processing performed on the substrate 9.

In the enlarged sealed space 100, the chemical solution dispersed from the upper surface 91 of the rotating substrate 9 is received by the cup part 161 through the annular opening 81 and guided to the liquid-receiving recessed part 165. The chemical solution guided to the liquid-receiving recessed part 165 flows through the first discharge passage 191 illustrated in FIG. 2 into the gas-liquid separating part 193. In the chemical-solution recovery part 195, the chemical solution is recovered from the gas-liquid separating part 193 and reused after impurities or the like are removed therefrom by a filter or the like.

After a predetermined period of time (e.g., 60 to 120 seconds) has elapsed since the supply of the chemical solution was started, the supply of the chemical solution from the scan nozzle 188 and the supply of the heated gas from the gas jet nozzles 180a are stopped. Then, the substrate rotation mechanism 15 increases the rotational speed of the substrate 9 to be higher than the steady-state rotational speed for only a predetermined period of time (e.g., one to three seconds) to remove the chemical solution from the substrate 9. Moreover, the scan nozzle 188 is rotated by the head rotation mechanism 891 and moved from the chamber space 120 into the lateral space 160 through the annular opening 81 as illustrated in FIG. 6.

Figure 7:
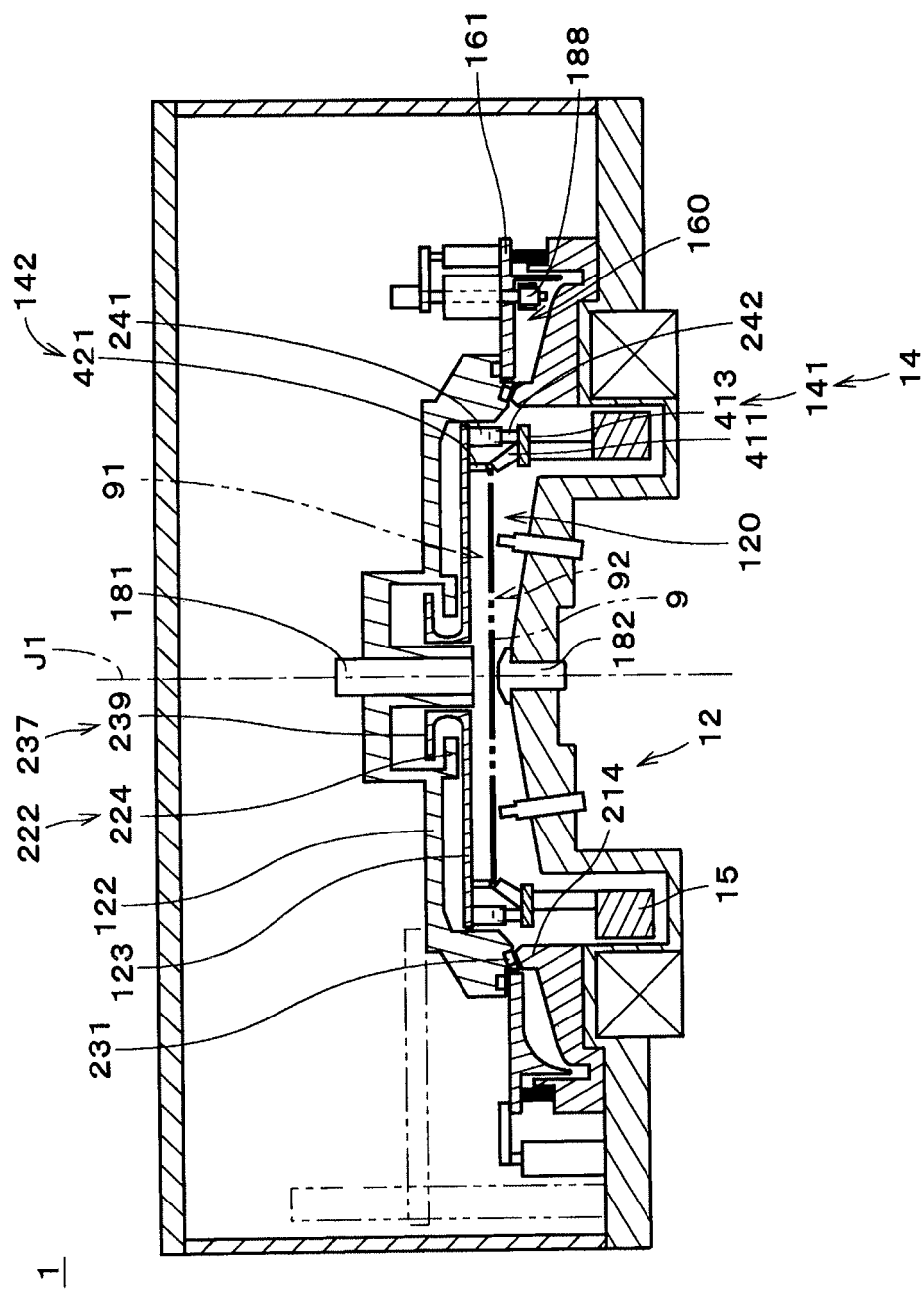
FIG. 7 is a cross-sectional view of the substrate processing apparatus.

Once the scan nozzle 188 has moved into the lateral space 160, the chamber lid part 122 and the cup part 161 move downward in synchronization with each other. Then, as illustrated in FIG. 7, the rip seal 232 provided at the lower end of the outer edge portion of the chamber lid part 122 is brought into contact with the top of the chamber side-wall part 214, so that the annular opening 81 is closed and the chamber space 120 is sealed while being isolated from the lateral space 160. The cup part 161 is located at the retracted position as in FIG. 4. The lateral space 160 is sealed while being isolated from the chamber space 120. Hereinafter, the state where the chamber 12 and the cup part 161 are as illustrated in FIG. 7 is referred to as a "second sealed state." In the second sealed state, the substrate 9 directly opposes the inner wall of the chamber 12, and no other liquid-receiving parts are present therebetween. The scan nozzle 188 is isolated from the chamber space 120 and housed in the lateral space 160.

In the second sealed state, the plurality of second contact parts 421 of the substrate pressing part 142 are in contact with the outer edge of the substrate 9. A plurality of pairs of magnets (not shown), the magnets of each pair facing each other in the up-down direction, are provided on the lower surface of the top plate 123 and the supporter base 413 of the substrate support part 141. Each pair of magnets is hereinafter also referred to as a "magnet pair." In the substrate processing apparatus 1, the plurality of magnet pairs are equiangularly disposed at different positions in the peripheral direction from those of the first contact parts 411, the second contact parts 421, the first engagement parts 241, and the second engagement parts 242. In a state where the substrate pressing part 142 is in contact with the substrate 9, a downward force is exerted on the top plate 123 by the magnetic force (attractive force) acting between the magnet pairs. This allows the substrate pressing part 142 to press the substrate 9 against the substrate support part 141.

In the substrate processing apparatus 1, the substrate pressing part 142 presses the substrate 9 against the substrate support part 141 with the weight of the top plate 123 and the magnetic force of the magnet pairs. Thus, the substrate 9 can be firmly held by sandwiching the substrate 9 from above and below between the substrate pressing part 142 and the substrate support part 141.

In the second sealed state, the flange part 239 of the held part 237 is located above and spaced from the flange part 224 of the plate holding part 222, and the plate holding part 222 and the held part 237 are not in contact with each other. In other words, the hold on the top plate 123 by the plate holding part 222 is released. The top plate 123 can thus be rotated independently of the chamber lid part 122 and along with the substrate holding part 14 and the substrate 9 held by the substrate holding part 14 by the substrate rotation mechanism 15.

Also in the second sealed state, the second engagement parts 242 fit in the recessed portions at the bottoms of the first engagement parts 241. Accordingly, the top plate 123 is engaged with the supporter base 413 of the substrate support part 141 in a peripheral direction about the central axis J1. In other words, the first engagement parts 241 and the second engagement parts 242 form a position restricting member that restricts the position of the top plate 123 relative to the substrate support part 141 in the rotational direction (i.e., fixes the relative positions in the peripheral direction). When the chamber lid part 122 moves downward, the rotation position of the supporter base 413 is controlled by the substrate rotation mechanism 15 so that the first engagement parts 241 and the second engagement parts 242 fit together.

When the chamber space 120 and the lateral space 160 are sealed independently of each other, the external exhaust part 194 (see FIG. 2) stops exhausting the gas, and the internal exhaust part 198 starts exhausting the gas contained in the chamber space 120. Then, the deionized-water supply part 184 starts supplying deionized water, which is a rinsing liquid or a cleaning liquid, to the substrate 9 (step S13).

The deionized water from the deionized-water supply part 184 is ejected from the upper nozzle 181 and the lower nozzle 182 and continuously supplied to the central parts of the upper surface 91 and the lower surface 92 of the substrate 9. The deionized water is spread to the outer peripheries of the upper surface 91 and the lower surface 92 as a result of the rotation of the substrate 9 and disperses to the outside from the outer peripheral edge of the substrate 9. The deionized water dispersed from the substrate 9 is received by the inner wall of the chamber 12 (i.e., the inner walls of the chamber lid part 122 and the chamber side-wall part 214) and discarded through the second exhaust passage 192, the gas-liquid separating part 197, and the drainage part 199, which are illustrated in FIG. 2 (the same applies to the process of drying the substrate 9, which will be described later). Thus, the chamber 12 is substantially cleaned during the processing for rinsing the upper surface 91 of the substrate 9 and the processing for cleaning the lower surface 92.

After a predetermined period of time has elapsed since the supply of the deionized water was started, the supply of the deionized water from the deionized-water supply part 184 is stopped. Then, the rotational speed of the substrate 9 is increased to be sufficiently higher than the steady-state rotational speed in the chamber space 120. Accordingly, the deionized water is removed from above the substrate 9 and processing for drying the substrate 9 is performed (step S14). After a predetermined period of time has elapsed since the drying of the substrate 9 was started, the rotation of the substrate 9 is stopped. The processing for drying the substrate 9 may be performed under a reduced-pressure atmosphere in which the pressure in the chamber space 120 is reduced to below the atmospheric pressure by the internal exhaust part 198.

Thereafter, the chamber lid part 122 and the top plate 123 are moved upward and the chamber 12 is in the open state as illustrated in FIG. 4. In step S14, little liquid remains on the lower surface of the top plate 123 because the top plate 123 rotates along with the substrate support part 141, and therefore liquid does not drop from the top plate 123 on the substrate during the upward movement of the chamber lid part 122. The substrate 9 is conveyed out of the chamber 12 by the external conveying mechanism (step S15). Note that, after the supply of the deionized water from the deionized-water supply part 184 and before the drying of the substrate 9, IPA may be supplied from the IPA supply part 185 onto the substrate 9 and the deionized water may be replaced with the IPA (the same applies to a substrate processing apparatus 1b, which will be described later).

As described above, in the substrate processing apparatus 1, the cup part 161 that forms the lateral space 160 along the outer periphery of the chamber 12 is provided, and when the cup part 161 is in contact with the chamber lid part 122 in a state where the chamber lid part 122 is separated from the chamber body 121 (i.e., where the annular opening 81 is formed), the chamber space 120 and the lateral space 160 form the single enlarged sealed space 100. In addition, the scan nozzle 188 is attached to the cup part 161 in the lateral space 160 and moved to above the substrate 9 through the annular opening 81 in the enlarged sealed space 100 to supply the chemical solution onto the substrate 9. During the processing for cleaning the substrate 9 and the processing for drying the substrate 9, the scan nozzle 188 is housed in the lateral space 160 and the upper opening of the chamber body 121 is closed by the chamber lid part 122 so that the chamber space 120 is isolated from the lateral space 160 and sealed.

In this way, in the substrate processing apparatus 1, the chamber space 120 can be isolated from the scan nozzle 188 (i.e., the ejection head 881 and the head support part 882) that supplies the chemical solution to the substrate 9 in the enlarged sealed space 100. Thus, the processing for cleaning the substrate 9 and the processing for drying the substrate 9 can be performed in a state where the substrate 9 is isolated from the scan nozzle 188. Consequently, it is possible to prevent a mist or the like of the chemical solution from the scan nozzle 188 from adhering to the substrate 9 that has undergone the cleaning processing and the dry processing.

In the substrate processing apparatus 1, when the chamber 12 and the cup part 161 transition from the first sealed state illustrated in FIG. 1 to the second sealed state illustrated in FIG. 7, the chamber lid part 122 and the cup part 161 move downward in synchronization with each other so that the chamber lid part 122 and the cup part 161 are not separated from each other. Thus, the chamber space 120 can be isolated from the scan nozzle 188 without opening the chamber space 120 during the processing of the substrate 9.

As described above, before the chemical-solution processing performed on the substrate 9 (step S12), the scan nozzle 188 is housed in the lateral space 160 above the liquid-receiving recessed part 165, and the chemical solution pre-dispensed from the scan nozzle 188 is received and recovered by the liquid-receiving recessed part 165. This eliminates the need for the substrate processing apparatus 1 to include a liquid receiving structure for pre-dispense, thus simplifying the configuration of the substrate processing apparatus 1.

In the substrate processing apparatus 1, the head rotation mechanism 891 is disposed outside the enlarged sealed space 100. Thus, the size of the enlarged sealed space 100 can be reduced. In addition, the head rotation mechanism 891 is fixed to the top of the cup part 161 and moves along with the cup part 161 in the up-down direction. Thus, the size of the substrate processing apparatus 1 can be reduced more than in the case where the head rotation mechanism 891 is disposed radially outward of the cup part 161. Moreover, there is no need to control the mechanism for moving the scan nozzle 188 up and down such that the scan nozzle 188 is moved up and down in synchronization with the up-down movement of the cup part 161. This simplifies the control of the substrate processing apparatus 1.

Figure 8:
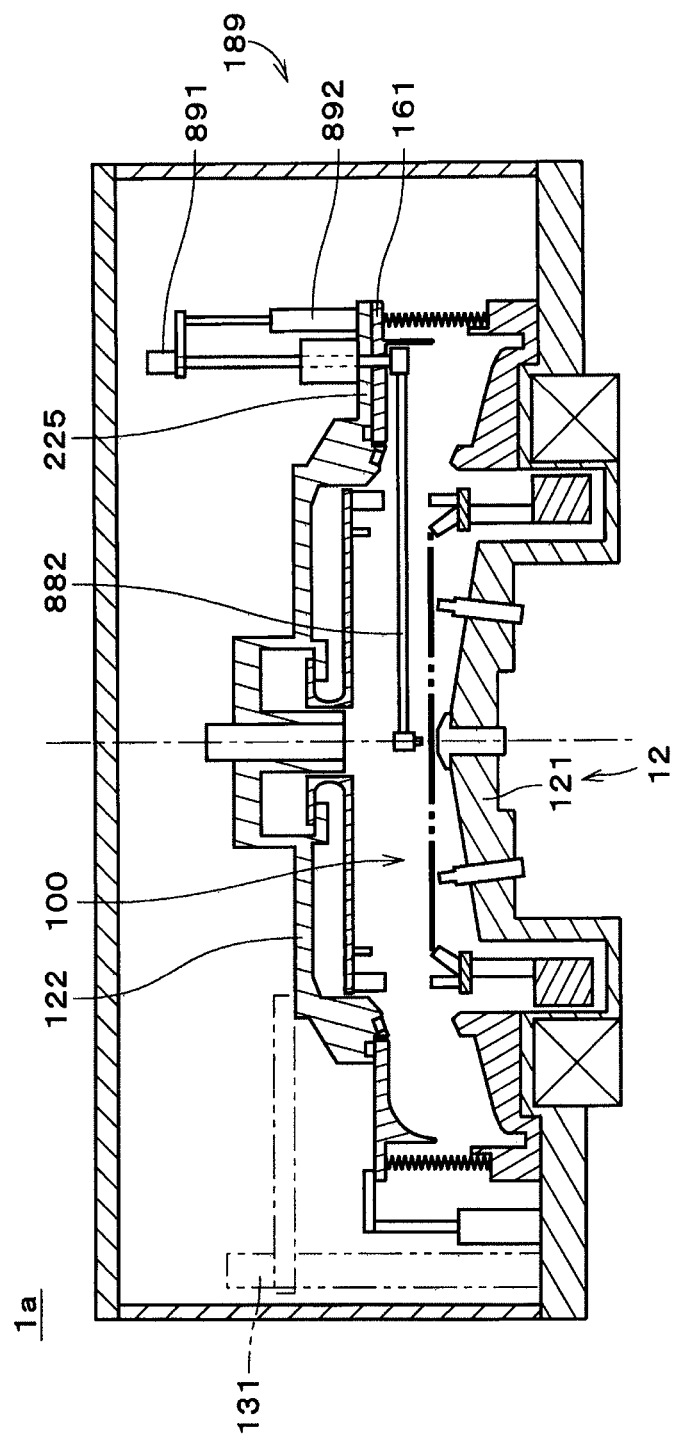
FIG. 8 is a cross-sectional view illustrating another example of the substrate processing apparatus.

FIG. 8 is a cross-sectional view illustrating another example of the substrate processing apparatus. In a substrate processing apparatus 1a illustrated in FIG. 8, the chamber lid part 122 of the chamber 12 has a protruding part 225 that extends radially outward along part of the periphery. The protruding part 225 is located above the fixed end of the head support part 882 and in contact with the upper surface of the upper surface part 612 of the cup part 161 that is located at the liquid-receiving position. The head rotation mechanism 891 and the head elevating mechanism 892 of the head movement mechanism 189 are fixed to the protruding part 225. The head rotation mechanism 891 and the head elevating mechanism 892 are moved relative to the chamber body 121 along with the chamber lid part 122 in the up-down direction by the chamber opening-and-closing mechanism 131.

Figure 9:
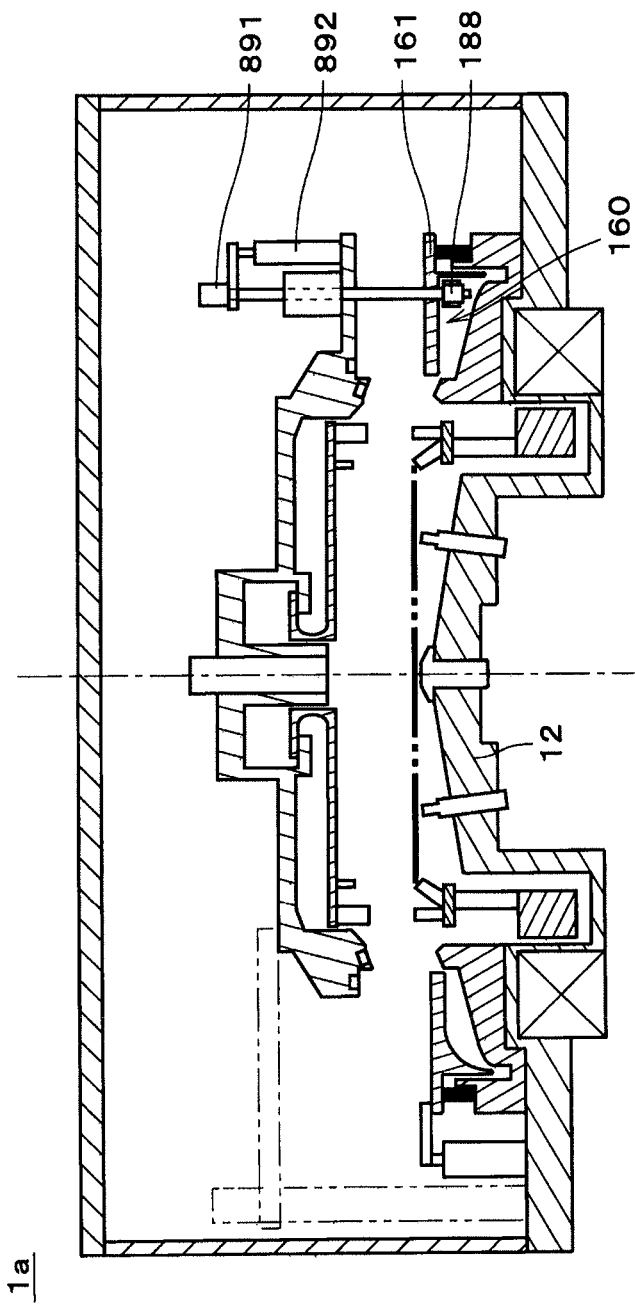
FIG. 9 is a cross-sectional view of the substrate processing apparatus.

When the cup part 161 is moved from the liquid-receiving position in FIG. 8 to the retracted position as illustrated in FIG. 9 and the chamber 12 and the cup part 161 are in the open state, the scan nozzle 188 is rotated by the head rotation mechanism 891, housed in the lateral space 160, and moved downward in synchronization with the cup part 161 by the head elevating mechanism 892. The other operations performed in the substrate processing apparatus 1a are the same as those performed in the substrate processing apparatus 1 illustrated in FIG. 1.

In the substrate processing apparatus 1a, the head rotation mechanism 891 is disposed outside the enlarged sealed space 100 illustrated in FIG. 8 as in the substrate processing apparatus 1. Thus, the size of the enlarged sealed space 100 can be reduced. The size of the substrate processing apparatus 1a can also be reduced because the head rotation mechanism 891 is fixed to the top of the chamber lid part 122.

Figure 10:
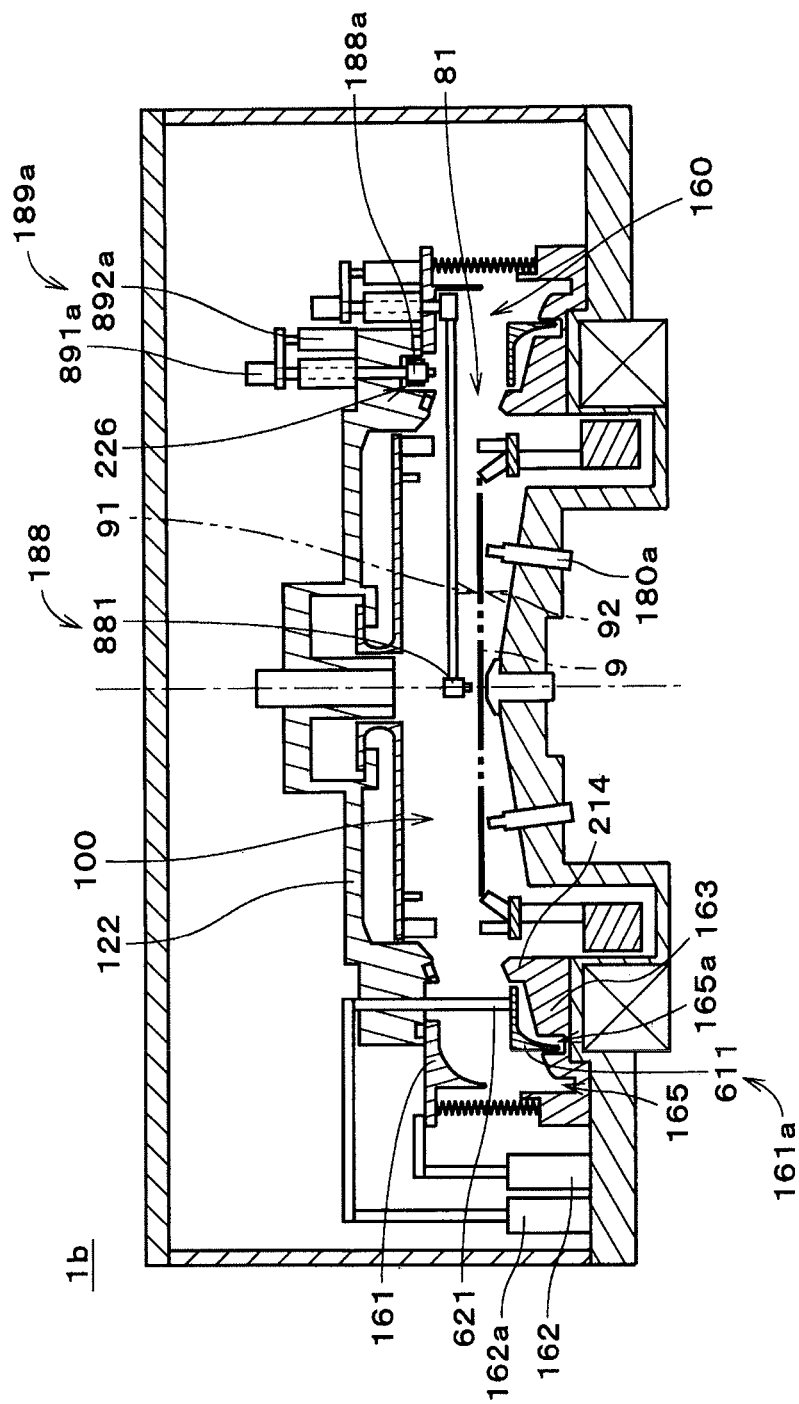
FIG. 10 is a cross-sectional view of a substrate processing apparatus according to a second embodiment.

FIG. 10 is a cross-sectional view of a substrate processing apparatus 1b according to a second embodiment of the present invention. The substrate processing apparatus 1b includes another cup part 161a that is located inward of the cup part 161, and another cup-part movement mechanism 162a for moving the cup part 161a independently of the cup part 161 in the up-down direction. The substrate processing apparatus 1b further includes another scan nozzle 188a different from the scan nozzle 188, and a head movement mechanism 189a for moving the scan nozzle 188a independently of the scan nozzle 188. The other constituent elements are substantially the same as those of the substrate processing apparatus 1 illustrated in FIG. 1, and constituent elements that correspond to those in FIG. 1 are given the same reference numerals.

In the following description, the cup parts 161 and 161a are respectively referred to as the "outer cup part 161" and the "inner cup part 161a." The cup-part movement mechanisms 162 and 162a are respectively referred to as the "outer cup-part movement mechanism 162" and the "inner cup-part movement mechanism 162a." The scan nozzles 188 and 188a are respectively referred to as the "outer scan nozzle 188" and the "inner scan nozzle 188a," and the head movement mechanisms 189 and 189a are respectively referred to as the "outer head movement mechanism 189" and the "inner head movement mechanism 189a." The inner scan nozzle 188a is connected to another chemical-solution supply part (not shown) different from the chemical-solution supply part 183 (see FIG. 2), and a chemical solution different from the chemical solution supplied to the outer scan nozzle 188 is supplied to the inner scan nozzle 188a.

The inner cup-part movement mechanism 162a includes a support member 621 that passes through the chamber lid part 122 in the up-down direction, and the lower end of the support member 621 is fixed to the top of the inner cup part 161a. As a result of the support member 621 being moved in the up-down direction in the inner cup-part movement mechanism 162a, the inner cup part 161a also moves in the up-down direction. The portion of the chamber lid part 122 where the inner cup-part movement mechanism 162a passes through is sealed to prevent passage of gas and liquid. In actuality, the inner cup-part movement mechanism 162a is disposed at a different position in the peripheral direction from that of the outer cup-part movement mechanism 162. The inner cup-part movement mechanism 162a is also disposed at a different position in the peripheral direction from that of the chamber opening-and-closing mechanism 131 (see FIG. 1).

In a first sealed state illustrated in FIG. 10, the outer cup part 161 is located at a liquid-receiving position that is radially outward of the annular opening 81. The inner cup part 161a is located below the annular opening 81 and radially outward of the chamber side-wall part 214. The lower end of a side-wall part 611 of the inner cup part 161a is located within an annular inner liquid-receiving recessed part 165a that is provided inward of the liquid-receiving recessed part 165 in the cup opposing part 163. The position of the inner cup part 161a illustrated in FIG. 10 is referred to as a "retracted position."

The outer scan nozzle 188 extends to above the substrate 9 from the lateral space 160 through the annular opening 81. The inner scan nozzle 188a is located above the outer scan nozzle 188. A generally arc-shaped housing recessed part 226 is formed in the bottom surface of the chamber lid part 122, and the inner scan nozzle 188a that has a generally arc-like shape like the outer scan nozzle 188 is housed in the housing recessed part 226. The housing recessed part 226 is also part of the lateral space 160. The inner head movement mechanism 189a is fixed to the top of the chamber lid part 122 above the housing recessed part 226. The inner head movement mechanism 189a includes a head rotation mechanism 891a and a head elevating mechanism 892a.

Figure 11:
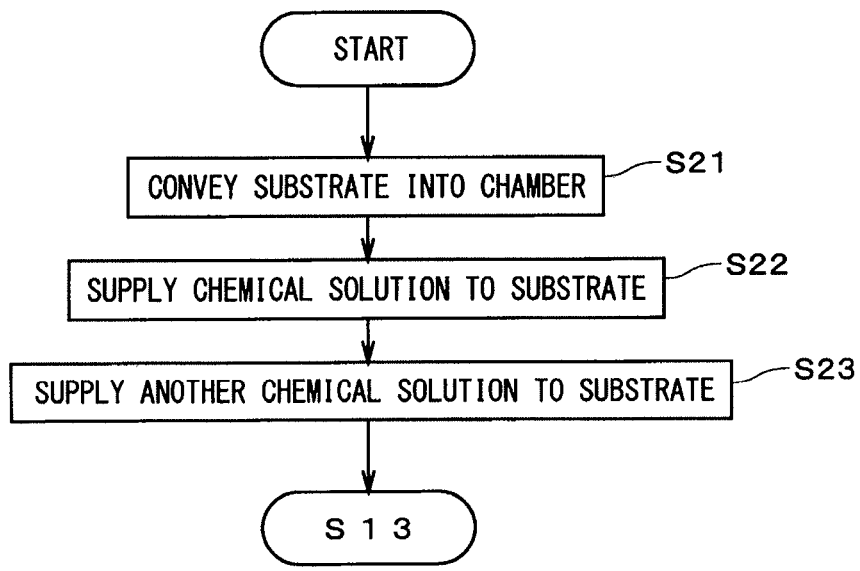
FIG. 11 is a flowchart of part of processing performed by the substrate processing apparatus.
Figure 12:
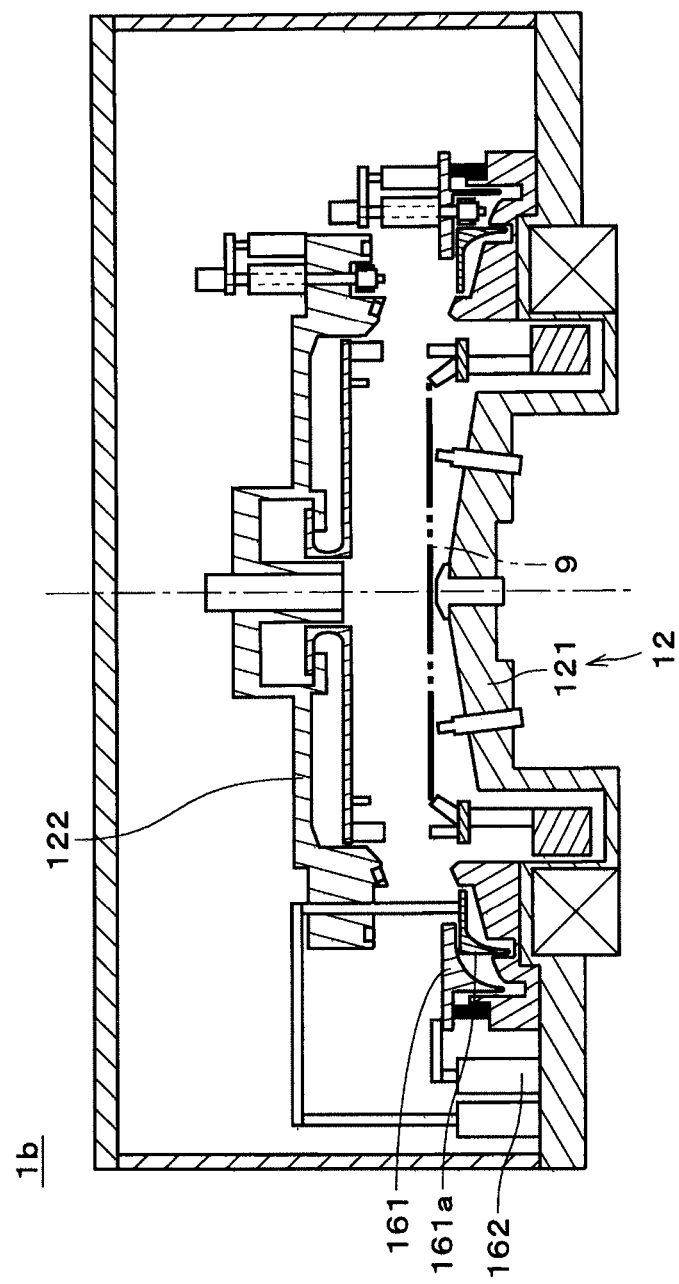
FIG. 12 is a cross-sectional view of the substrate processing apparatus.

FIG. 11 is part of a flowchart of processing performed on the substrate 9 by the substrate processing apparatus 1b. In the substrate processing apparatus 1b, the substrate 9 is conveyed into the chamber 12 in an open state in which the chamber lid part 122 is located above and separated from the chamber body 121, and the outer cup part 161 and the inner cup part 161a are respectively located at the retracted positions as illustrated in FIG. 12 (step S21). Next, the outer cup part 161 is moved up to the liquid-receiving position, which is in contact with the chamber lid part 122, by the outer cup-part movement mechanism 162, and the enlarged sealed space 100 is formed as illustrated in FIG. 13.

Figure 13:
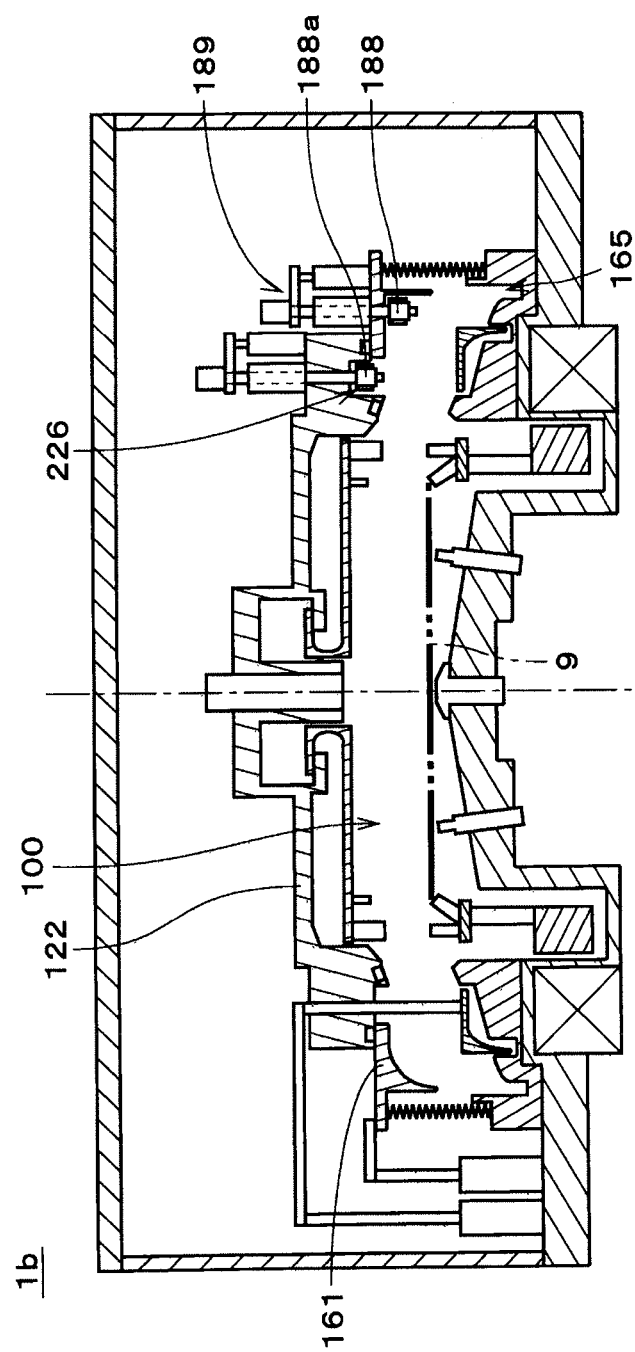
FIG. 13 is a cross-sectional view of the substrate processing apparatus.

In a first sealed state illustrated in FIG. 13, the rotation of the substrate 9 at the steady-state rotational speed is started as in the substrate processing apparatus 1 illustrated in FIG. 7, and the enlarged sealed space 100 enters an inert-gas-filled state as a result of the supply of an inert gas. In addition, a chemical solution is pre-dispensed from the outer scan nozzle 188 toward the liquid-receiving recessed part 165.

Next, the outer scan nozzle 188 is rotated by the outer head movement mechanism 189, and the ejection head 881 of the outer scan nozzle 188 is located above the substrate 9 as illustrated in FIG. 10. Then, a chemical solution is supplied from the ejection head 881 of the outer scan nozzle 188 that repeats reciprocating movement above the substrate 9 onto the rotating substrate 9, while a heated gas is ejected from the plurality of gas jet nozzles 180a toward the lower surface 92 of the substrate 9 (step S22). In the enlarged sealed space 100, the chemical solution dispersed from the upper surface 91 of the rotating substrate 9 is received by the outer cup part 161 through the annular opening 81 and guided to the liquid-receiving recessed part 165.

Figure 14:
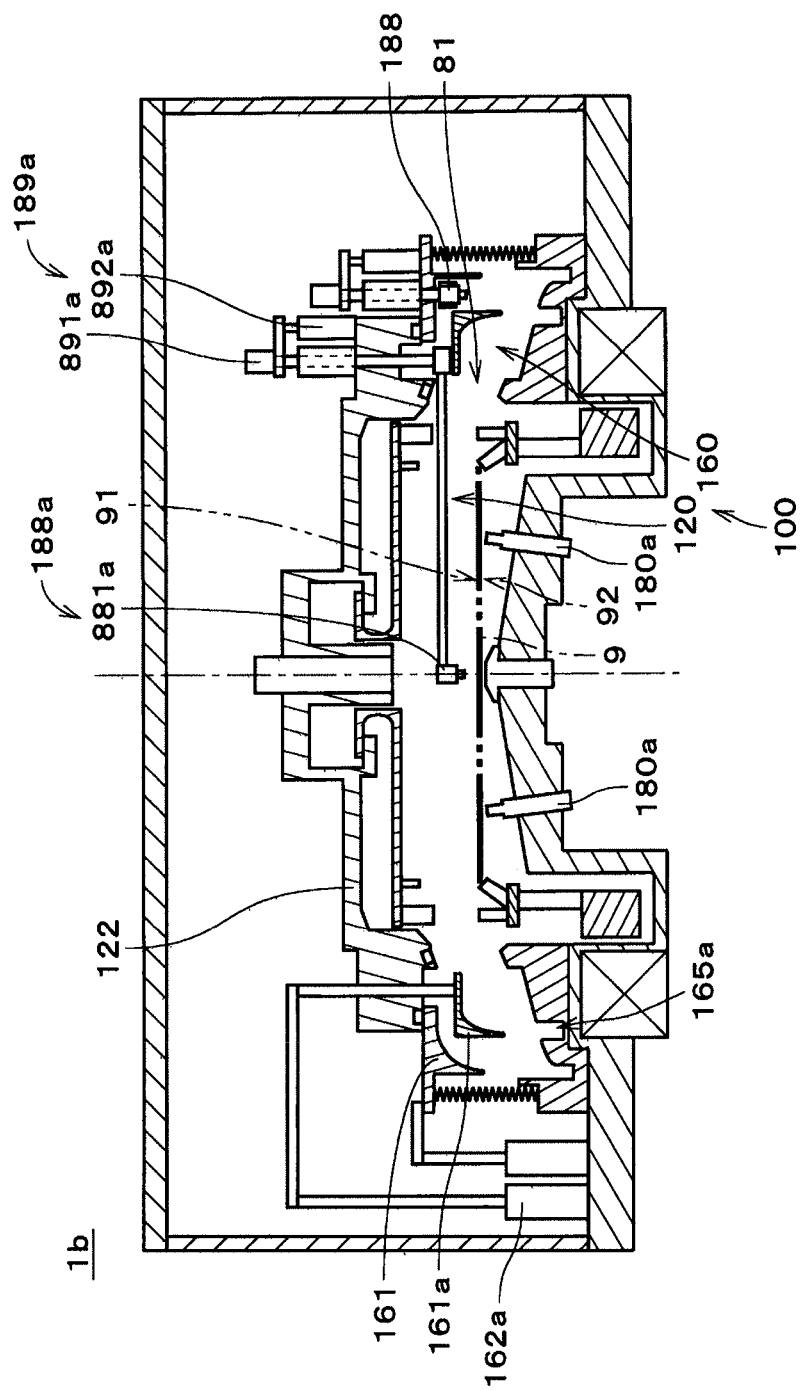
FIG. 14 is a cross-sectional view of the substrate processing apparatus.

After the processing for supplying the chemical solution from the outer scan nozzle 188 is completed, the outer scan nozzle 188 is rotated and moved from the chamber space 120 to the lateral space 160 through the annular opening 81 as illustrated in FIG. 14. The chemical solution on the substrate 9 is removed by the rotation of the substrate 9. Then, the inner scan nozzle 188a is moved downward and rotated by the head elevating mechanism 892a and the head rotation mechanism 891a of the inner head movement mechanism 189a. Thus, an ejection head 881a of the inner scan nozzle 188a is moved from the lateral space 160 to the chamber space 120 through the annular opening 81 and located above the substrate 9.

Moreover, the inner cup part 161a is moved upward from the retracted position by the inner cup-part movement mechanism 162a and located radially outward of and around the entire periphery of the annular opening 81 in the enlarged sealed space 100. The position of the inner cup part 161a illustrated in FIG. 14 is referred to as a "liquid-receiving position." The inner cup part 161a located at the liquid-receiving position is located below the fixed end of the inner scan nozzle 188a and in close proximity to the fixed end. The inner cup-part movement mechanism 162a moves the inner cup part 161a in the up-down direction between the liquid-receiving position that is radially outward of the annular opening 81 and the retracted position that is below the liquid-receiving position.

When the inner cup part 161a is located at the liquid-receiving position, another chemical solution different from that in step S22 is supplied onto the rotating substrate 9 from the ejection head 881a of the inner scan nozzle 188a that repeats reciprocating movement above the substrate 9, while the heated gas is ejected as necessary from the plurality of gas jet nozzles 180a toward the lower surface 92 of the substrate 9 (step S23). In the enlarged sealed space 100, the chemical solution dispersed from the upper surface 91 of the rotating substrate 9 is received by the inner cup part 161a through the annular opening 81 and guided to the inner liquid-receiving recessed part 165a. The chemical solution guided to the inner liquid-receiving recessed part 165a is recovered independently of the chemical solution from the outer scan nozzle 188 and reused after impurities and the like have been removed.

After the processing for supplying the chemical solution from the inner scan nozzle 188a is completed, this chemical solution on the substrate 9 is removed by rotation of the substrate 9. Then, the inner cup part 161a is moved downward from the liquid-receiving position to the retracted position. Furthermore, the inner scan nozzle 188a is rotated and moved from the chamber space 120 to the lateral space 160 through the annular opening 81. The inner scan nozzle 188a is moved upward by the head elevating mechanism 892a of the inner head movement mechanism 189a and housed in the housing recessed part 226 as illustrated in FIG. 13.

Figure 15:
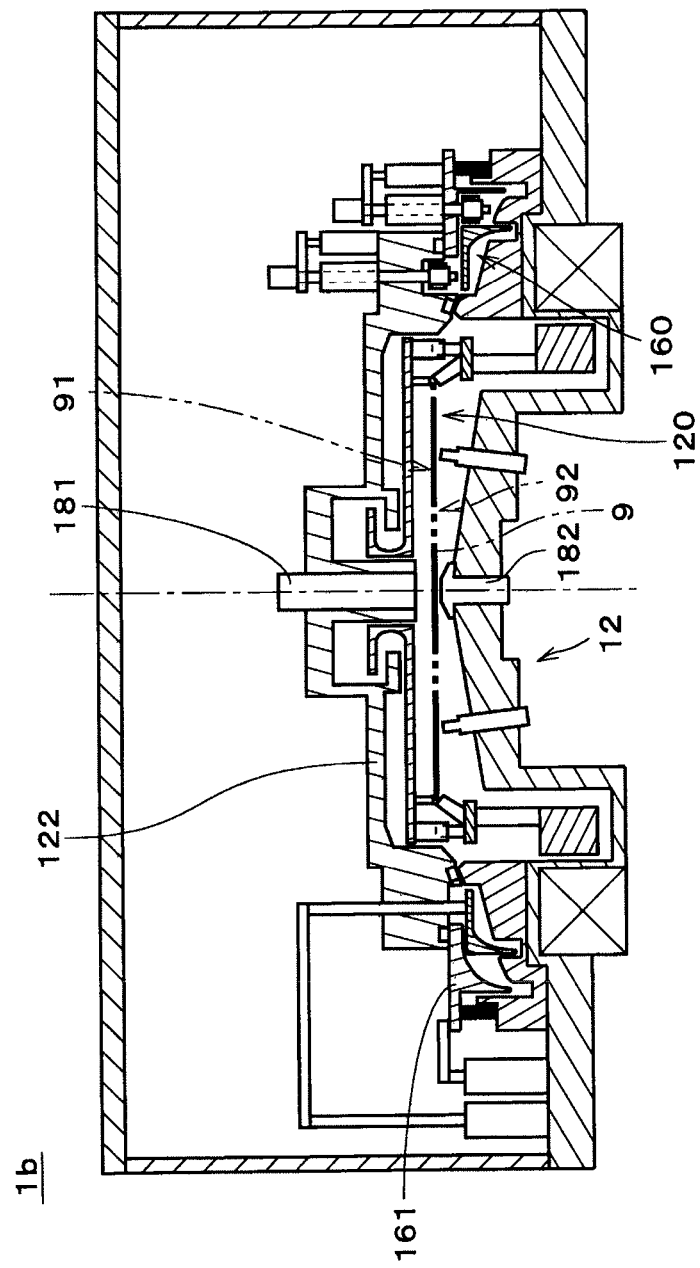
FIG. 15 is a cross-sectional view of the substrate processing apparatus.

Next, the chamber lid part 122 and the outer cup part 161 move downward in synchronization with each other and enter a second sealed state as illustrated in FIG. 15. The outer cup part 161 is located at the retracted position. In FIG. 15, the annular opening 81 is closed, and the chamber space 120 and the lateral space 160 are sealed while being isolated from each other.

Thereafter, as in the aforementioned steps S13 to S15 (see FIG. 3), deionized water is supplied from the upper nozzle 181 and the lower nozzle 182 toward the upper surface 91 and the lower surface 92 of the rotating substrate 9 in the sealed chamber space 120 (step S13). Thus, the processing for rinsing the upper surface 91 of the substrate 9 and the processing for cleaning the lower surface 92 are performed. Then, the supply of the deionized water is stopped, and dry processing for removing the deionized water on the substrate 9 by rotation of the substrate 9 is performed (step S14). Thereafter, the chamber lid part 122 is moved upward, the chamber 12 enters the open state illustrated in FIG. 12, and the substrate 9 is conveyed out of the chamber 12 (step S15).

As described above, the substrate processing apparatus 1b includes, in addition to the constituent elements of the substrate processing apparatus 1 illustrated in FIG. 1, the inner cup part 161a that is located radially outward of and around the entire periphery of the annular opening 81 in the enlarged sealed space 100, and the inner cup-part movement mechanism 162a for moving the inner cup part 161a independently of the outer cup part 161 between the liquid-receiving position and the retracted position. This allows the chemical solution supplied from the outer scan nozzle 188 to the substrate 9 and the other chemical solution supplied from the inner scan nozzle 188a to the substrate 9 to be recovered separately. Consequently, each chemical solution can be reused efficiently.

In the substrate processing apparatus 1b, the chamber space 120 can be isolated from the lateral space 160 and sealed by closing the upper opening of the chamber body 121 with the chamber lid part 122 as in the substrate processing apparatus 1. The chamber space 120 can thus be isolated from the outer scan nozzle 188 and the inner scan nozzle 188a. This consequently prevents a mist or the like of the chemical solution from the outer scan nozzle 188 and the inner scan nozzle 188a from adhering to the substrate 9 that has undergone the cleaning processing and the dry processing.

Figure 16:
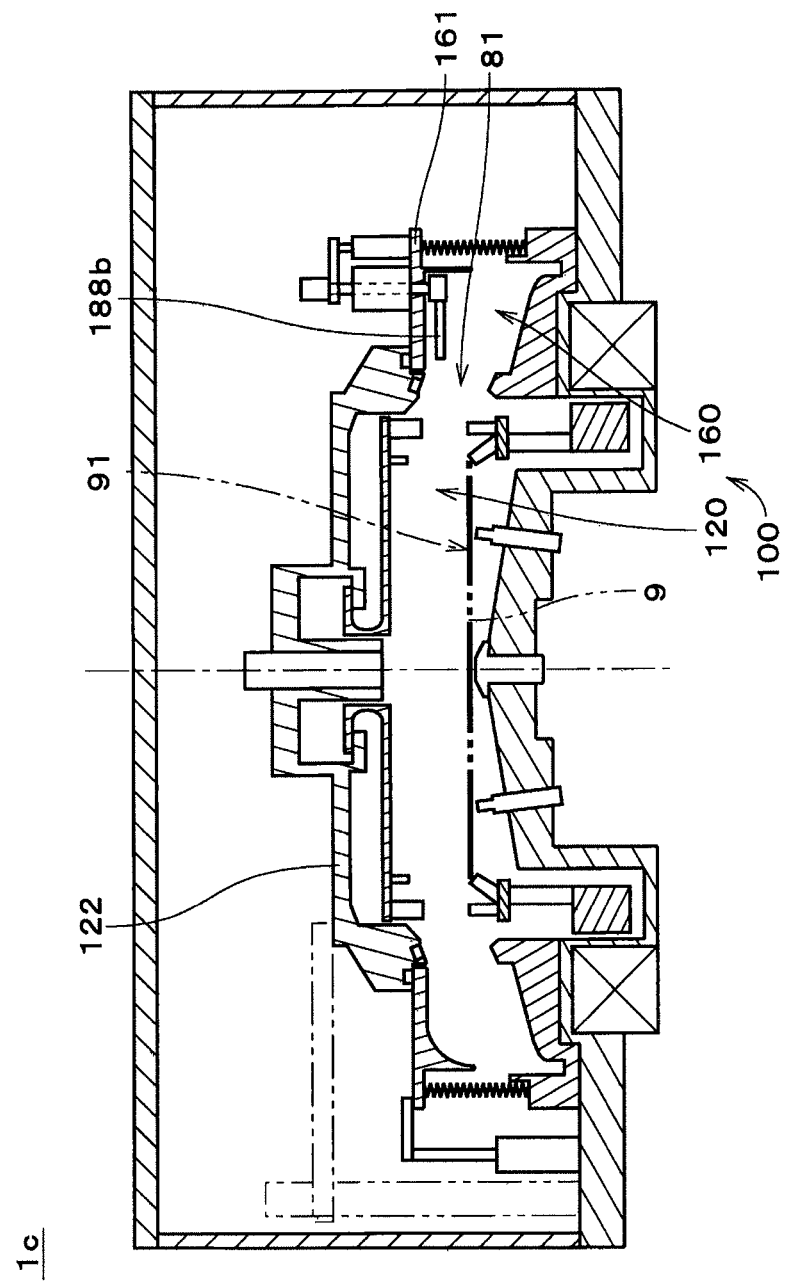
FIG. 16 is a cross-sectional view illustrating another example of the substrate processing apparatus.

FIG. 16 is a cross-sectional view illustrating another example of the substrate processing apparatus. A substrate processing apparatus 1c illustrated in FIG. 16 includes a scan nozzle 188b, instead of the scan nozzle 188 of the substrate processing apparatus 1 illustrated in FIG. 1. The scan nozzle 188b is attached to the cup part 161 in the lateral space 160. The scan nozzle 188b ejects a chemical solution in approximately a horizontal direction. The chemical solution ejected from the scan nozzle 188b in the lateral space 160 is supplied onto the upper surface 91 of the substrate 9 through the annular opening 81. The scan nozzle 188b is turned within a predetermined angular range in the horizontal direction about the fixed end. This moves a liquid-landing position of the chemical solution from the scan nozzle 188b on the substrate 9. In the substrate processing apparatus 1b, the chemical solution is supplied to the rotating substrate 9 while repeating the turning of the scan nozzle 188b in the enlarged sealed space 100.

After the supply of the chemical solution, the chamber lid part 122 and the cup part 161 are moved downward to close the annular opening 81, and the chamber space 120 and the lateral space 160 are sealed while being isolated from each other. The scan nozzle 188b is housed in the lateral space 160. In this way, in the substrate processing apparatus 1c, the chamber space 120 can be isolated from the scan nozzle 188b. Consequently, it is possible to prevent a mist or the like of the chemical solution from the scan nozzle 188b from adhering to the substrate 9 that has undergone the cleaning processing and the dry processing. Note that, like the scan nozzle 188 illustrated in FIG. 8, the scan nozzle 188b may be attached to the chamber lid part 122 in the lateral space 160.

The above-described substrate processing apparatuses 1 and 1a to 1c can be modified in various ways.

For example, the substrate processing apparatus 1 illustrated in FIG. 1 may be configured such that the upper surface part 612 of the cup part 161 has a depressed part that is depressed upward and opens downward, and part or the whole of the scan nozzle 188 is housed in the depressed part that is part of the lateral space 160 as a result of the scan nozzle 188 being rotated and moved from above the substrate 9 into the lateral space 160 and then moved upward by the head elevating mechanism 892. Pre-dispensing of the chemical solution from the ejection head 881 does not necessarily have to be conducted in the enlarged sealed space 100, and the chemical solution may be pre-dispensed in the lateral space 160 in, for example, the substrate processing apparatus 1 that is in the open state illustrated in FIG. 4.

The substrate processing apparatus 1b illustrated in FIG. 10 may be configured such that the inner scan nozzle 188a and the inner head movement mechanism 189a are omitted and a plurality of types of chemical solutions are sequentially supplied from the outer scan nozzle 188. Even in this case, the plurality of types of chemical solutions can be recovered separately by causing the outer cup part 161 to receive a first chemical solution dispersed from the substrate 9 during first chemical-solution processing and causing the inner cup part 161a that has moved up to the liquid-receiving position to receive a second chemical solution dispersed from the substrate 9 during second chemical-solution processing. Note that one of the first chemical solution and the second chemical solution may be supplied from the upper nozzle 181 to the substrate 9.

The substrate processing apparatuses 1 and 1a to 1c may include a pressure application part for supplying a gas to the chamber space 120 to apply pressure. The chamber space 120 is pressurized in a state where the chamber 12 is sealed, i.e., where the chamber space 120 is isolated from the lateral space 160, and placed in a pressurized atmosphere that is higher than atmospheric pressure. Note that the inert-gas supply part 186 may also serve as the pressure application part.

The chamber opening-and-closing mechanism 131 does not necessarily have to move the chamber lid part 122 in the up-down direction, and may move the chamber body 121 in the up-down direction in a state where the chamber lid part 122 is fixed. The shape of the chamber 12 is not limited to a generally cylindrical shape and may be of various shapes.

The shapes and structures of the stator 151 and the rotor 152 of the substrate rotation mechanism 15 may be modified in various ways. The rotor 152 does not necessarily have to be rotated in a floating state, and a configuration is possible in which a structure such as a guide that mechanically supports the rotor 152 is provided in the chamber 12, and the rotor 152 is rotated along the guide. The substrate rotation mechanism 15 does not necessarily have to be a hollow motor, and an axial rotation motor may be used as a substrate rotation mechanism.

In the substrate processing apparatuses 1, 1a to 1c, the enlarged sealed space 100 may be formed by bringing an area (e.g., the side-wall part 611) of the (outer) cup part 161 other than the upper surface part 612 into contact with the chamber lid part 122. The shapes of the (outer) cup part 161 and the inner cup part 161a can be appropriately changed.

The shapes of the upper nozzle 181, the lower nozzle 182, the (outer) scan nozzle 188, the inner scan nozzle 188a, and the scan nozzle 188b are not limited to a protruding shape. The concept of nozzles according to the embodiments of the present invention includes any part that has an ejection outlet from which a processing liquid is ejected.

The substrate processing apparatuses 1 and 1a to 1c may be used to process not only semiconductor substrates but also glass substrates used in display devices such as liquid crystal displays, plasma displays, and field emission displays (FEDs). The substrate processing apparatuses 1 and 1a to 1c may also be used to process substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST 1, 1a-1c Substrate processing apparatus
9 Substrate
12 Chamber
14 Substrate holding part
15 Substrate rotation mechanism
81 Annular opening
100 Enlarged sealed space
120 Chamber space
121 Chamber body
122 Chamber lid part
131 Chamber opening-and-closing mechanism
160 Lateral space
161 (Outer) cup part
161a Inner cup part
162 (Outer) cup-part movement mechanism
162a Inner cup-part movement mechanism
188 (Outer) scan nozzle
188a Inner scan nozzle
188b Scan nozzle
881, 881a Ejection head
882 Head support part
891, 891a Head rotation mechanism
J1 Central axis
S11-S15, S21-S23 Step

The invention claimed is:

1. A substrate processing apparatus for processing a substrate, comprising:
a chamber that includes a chamber body and a chamber lid part, which form a chamber space, and in which said chamber space is sealed by closing an upper opening of said chamber body with said chamber lid part, said chamber body including a chamber sidewall part, said chamber space being a space between said chamber lid part and said chamber body;
a lid elevator for moving said chamber lid part relative to said chamber body in an up-down direction to open and close said chamber;
a substrate holder disposed in said chamber space and for holding a substrate in a horizontal state;
a motor arranged for rotating said substrate along with said substrate holder about a central axis pointing in the up-down direction;
a cup part located outside of and around an entire periphery of said chamber, forming an annular lateral space along an outer periphery of said chamber, and for receiving a processing liquid dispersed from said substrate that is being rotated, through an annular opening that is formed around said substrate when said chamber lid part is separated from said chamber body, said annular lateral space being a space formed between said cup part and a cup opposing part, said cup opposing part being a portion of said chamber sidewall part and located below said cup part, said annular opening is an opening between said chamber lid part and said chamber body;
an ejection head attached to said cup part in said annular lateral space and supported for moving to above said substrate through said annular opening and supplying a processing liquid onto said substrate;
a head supporter that is a member extending in a horizontal direction and has a free end to which said ejection head is fixed and a fixed end attached to said cup part in said annular lateral space; and
a head rotator for rotating said head supporter along with said ejection head about said fixed end,
wherein, when said cup part is in contact with said chamber lid part in a state where said annular opening is formed, said chamber space and said annular lateral space form a single enlarged sealed space by communicating said chamber space and said annular lateral space through said annular opening,
wherein, when the processing liquid is supplied onto said substrate, said head supporter is rotated by said head rotator to move said ejection head to above said substrate through said annular opening, and
wherein said head rotator is fixed to an upper part of said cup part.

2. The substrate processing apparatus according to claim 1, wherein said head rotator is disposed outside said enlarged sealed space.

3. The substrate processing apparatus according to claim 2, further comprising:
a cup-part elevator for moving said cup part in the up-down direction between a liquid-receiving position that is outside said annular opening and a retracted position that is below said liquid-receiving position,
wherein said head rotator moves along with said cup part in the up-down direction.

4. The substrate processing apparatus according to claim 1, wherein
when said ejection head supplies the processing liquid onto said substrate, said head rotator moves said ejection head back and forth along a predetermined travel path, above said substrate that is being rotated by said motor.

5. The substrate processing apparatus according to claim 1, further comprising:
another cup part located outside of and around an entire periphery of said annular opening in said enlarged sealed space and for receiving the processing liquid dispersed from said substrate that is being rotated; and
another cup-part elevator for moving said another cup part independently of said cup part in the up-down direction between a liquid-receiving position that is outside said annular opening and a retracted position that is below said liquid-receiving position.

6. The substrate processing apparatus according to claim 1, wherein
the processing liquid is pre-dispensed from said ejection head in a state where said ejection head is housed in said annular lateral space.

7. The substrate processing apparatus according to claim 1, wherein
when said chamber lid part is separated upward from said chamber body, said annular opening is formed between an outer edge portion of said chamber lid part and an upper end portion of said chamber sidewall part, and
when said outer edge portion of said chamber lid part is brought into contact with said upper end portion of said chamber sidewall part, said upper opening of said chamber body and said annular opening is closed.

* * * * *